US010396119B2

(12) United States Patent
Kim et al.

(10) Patent No.: US 10,396,119 B2
(45) Date of Patent: Aug. 27, 2019

(54) UNIT PIXEL OF IMAGE SENSOR, IMAGE SENSOR INCLUDING THE SAME AND METHOD OF MANUFACTURING IMAGE SENSOR

(71) Applicant: SAMSUNG ELECTRONICS CO., LTD., Suwon-si (KR)

(72) Inventors: Yong-Chan Kim, Seongnam-si (KR); Seung-Sik Kim, Hwaseong-si (KR); Eun-Sub Shim, Anyang-si (KR); Moo-Sup Lim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/905,007

(22) Filed: Feb. 26, 2018

(65) Prior Publication Data

US 2018/0182807 A1 Jun. 28, 2018

Related U.S. Application Data

(62) Division of application No. 14/660,570, filed on Mar. 17, 2015, now Pat. No. 9,929,204.

(30) Foreign Application Priority Data

Mar. 13, 2014 (KR) ........................ 10-2014-0029839
Mar. 26, 2014 (KR) ........................ 10-2014-0035348
Apr. 17, 2014 (KR) ........................ 10-2014-0046109

(51) Int. Cl.
*H01L 27/146* (2006.01)
*H01L 27/148* (2006.01)
*H04N 5/355* (2011.01)

(52) U.S. Cl.
CPC .... *H01L 27/14683* (2013.01); *H01L 27/1463* (2013.01); *H01L 27/1464* (2013.01);
(Continued)

(58) Field of Classification Search
CPC ......... H01L 27/14683; H01L 27/14689; H01L 27/146; H01L 27/14601; H01L 27/14609;
(Continued)

(56) References Cited

U.S. PATENT DOCUMENTS 6,815,791 B1 11/2004 Dierickx
7,075,049 B2 7/2006 Rhodes
(Continued)

FOREIGN PATENT DOCUMENTS

JP 2008-205639 A 9/2008
JP 2008-537340 A 9/2008
(Continued)

*Primary Examiner* — John R Lee
(74) *Attorney, Agent, or Firm* — Sughrue Mion, PLLC

(57) ABSTRACT

Provided are a unit pixel, an image sensor including the same, a portable electronic device including the same, and a method of manufacturing the same. The method of manufacturing includes: forming a photoelectric conversion region in a substrate; forming, in the substrate, a first floating diffusion region spaced apart from the photoelectric conversion region of the substrate, and a second floating diffusion region spaced apart from the first floating diffusion region; forming a first recess spaced apart from the first floating diffusion region and the second floating diffusion region by removing a portion of the substrate from a first surface of the substrate; filling the first recess to form a dual conversion gain (DCG) gate that extends perpendicularly or substantially perpendicularly from the first surface of the substrate; and forming a conductive layer to fill an inside of the first recess.

20 Claims, 31 Drawing Sheets

100

170
OUTPUT UNIT
VPIX
INCIDENT LIGHT
TX
TG
DX
DG
TP
101a
PD
D2
FD1
D1
BP
FD2
101
101b

(52) U.S. Cl.
CPC .. *H01L 27/14614* (2013.01); *H01L 27/14638* (2013.01); *H01L 27/14689* (2013.01); *H01L 27/14806* (2013.01); *H04N 5/3559* (2013.01); *H01L 27/14621* (2013.01); *H01L 27/14627* (2013.01)

(58) Field of Classification Search
CPC ........... H01L 27/1461; H01L 27/14612; H01L 27/14614; H01L 27/1463; H01L 27/14638; H01L 27/1464; H01L 27/14806; H01L 27/14621; H01L 27/14627; H01L 27/148; H04N 5/335; H04N 5/351; H04N 5/355; H04N 5/3559
See application file for complete search history.

(56) References Cited

U.S. PATENT DOCUMENTS

| | | | | |
|---|---|---|---|---|
| 7,432,540 | B2 | 10/2008 | McKee | |
| 7,468,532 | B2 | 12/2008 | McKee | |
| 7,683,306 | B2 | 3/2010 | McKee | |
| 7,718,459 | B2 | 5/2010 | Patrick | |
| 7,994,464 | B2 | 8/2011 | McKee | |
| 8,077,237 | B2 | 12/2011 | Li | |
| 8,158,921 | B2 | 4/2012 | McKee | |
| 8,426,796 | B2 | 4/2013 | Mao et al. | |
| 8,575,533 | B2 | 11/2013 | Yen et al. | |
| 9,590,127 | B2 | 3/2017 | Roy | |
| 9,929,204 | B2 * | 3/2018 | Kim | H01L 27/1463 |
| 2004/0251394 | A1 | 12/2004 | Rhodes et al. | |
| 2006/0231875 | A1 | 10/2006 | Patrick et al. | |
| 2007/0023798 | A1 | 2/2007 | McKee | |
| 2007/0035649 | A1 | 2/2007 | McKee | |
| 2007/0278536 | A1 | 12/2007 | Adachi | |
| 2008/0237446 | A1 | 10/2008 | Oshikubo et al. | |
| 2012/0256077 | A1 | 10/2012 | Yen | |
| 2013/0009043 | A1 | 1/2013 | Mao | |
| 2013/0175582 | A1 | 7/2013 | Ihara et al. | |
| 2013/0193496 | A1 | 8/2013 | Hisanori | |
| 2013/0221410 | A1 | 8/2013 | Ahn | |
| 2013/0256510 | A1 | 10/2013 | Lyu | |
| 2013/0307040 | A1 | 11/2013 | Ahn et al. | |
| 2013/0320407 | A1 | 12/2013 | Ahn | |
| 2014/0078368 | A1 | 3/2014 | Komori | |
| 2014/0084143 | A1 | 3/2014 | Sakano et al. | |
| 2014/0239154 | A1 | 8/2014 | Chen | |
| 2015/0115332 | A1 | 4/2015 | Hynecek | |
| 2015/0145007 | A1 | 5/2015 | Chieh | |
| 2015/0279899 | A1 | 10/2015 | Kim | |
| 2016/0035784 | A9 | 2/2016 | Kim | |
| 2018/0182807 | A1 * | 6/2018 | Kim | H01L 27/1463 |

FOREIGN PATENT DOCUMENTS

| | | | |
|---|---|---|---|
| JP | 4457134 | B2 | 4/2010 |
| JP | 2013-21533 | A | 1/2013 |
| KR | 10-0871056 | B1 | 11/2008 |
| KR | 10-0933141 | B1 | 12/2009 |
| KR | 10-0940708 | B1 | 2/2010 |
| KR | 10-2013-0081953 | A | 7/2013 |
| KR | 10-2013-0087905 | A | 8/2013 |
| KR | 10-2013-0128992 | A | 11/2013 |

* cited by examiner

201
RD
VDD
RST
RG
CR
FD2
CDG3
VPIX
280
VDD
TP
DX
DG
CDG4
CDG2
BP
CD
CS
CDG1
FD1
Cj
CT
TX
TG
PD
INCIDENT
LIGHT

1000
APPLICATION PROCESSOR
1110
PHY
1113
DigRF MASTER
1114
CSI HOST
DES
1112
DSI HOST
SER
1111
MIPI DigRF
RF CHIP
1160
PHY
1161
DigRF SLAVE
1162
GPS
1120
UWB
1210
WLAN
1220
WIMAX
1230
SPEAKER
1190
MIC
1180
STORAGE
1170
DRAM
1185
CAMERA SERIAL INTERFACE
SER
CSI DEVICE
IMAGE SENSOR
1141
1140
DISPLAY SERIAL INTERFACE
DES
DSI DEVICE
DISPLAY
1151
1150

UNIT PIXEL OF IMAGE SENSOR, IMAGE SENSOR INCLUDING THE SAME AND METHOD OF MANUFACTURING IMAGE SENSOR

CROSS-REFERENCE TO RELATED APPLICATIONS

This application is a divisional application of U.S. patent application Ser. No. 14/660,570, filed on Mar. 17, 2015, issued as U.S. Pat. No. 9,929,204, which claims priority from Korean Patent Application No. 10-2014-0029839, filed on Mar. 13, 2014 in the Korean Intellectual Property Office (KIPO), Korean Patent Application No. 10-2014-0035348, filed on Mar. 26, 2014 in the KIPO, and Korean Patent Application No. 10-2014-0046109, filed on Apr. 17, 2014 in the KIPO, the contents of which are herein incorporated by reference in their entireties.

BACKGROUND

1. Technical Field

Apparatuses and methods consistent with exemplary embodiments relate to image sensors, and more particularly to unit pixels of image sensors, image sensors including the unit pixels and methods of manufacturing the image sensors.

2. Description of the Related Art

An image sensor is a semiconductor device that transforms incident light into an electric signal (i.e., performs photoelectric transformation) to provide image information corresponding to the incident light. Typically, a unit pixel of the image sensor includes a photoelectric conversion region and a floating diffusion region. A conversion gain of the image sensor represents the efficiency of the image sensor in converting photo-charges collected by the photoelectric conversion region into an output voltage signal. The conversion gain of the image sensor may be determined based on a capacitance associated with the floating diffusion region.

SUMMARY

Accordingly, exemplary embodiments are provided to substantially obviate one or more problems due to limitations and disadvantages of the related art.

Aspects of one or more exemplary embodiments provide a unit pixel of an image sensor capable of effectively adjusting a conversion gain of the unit pixel.

Aspects of one or more exemplary embodiments provide an image sensor including the unit pixel.

Aspects of one or more exemplary embodiments provide a method of manufacturing the image sensor.

According to an aspect of an exemplary embodiment, there is provided a method of manufacturing a unit pixel of an image sensor, the method including: forming a photoelectric conversion region in a substrate; forming, in the substrate, a first floating diffusion region spaced apart from the photoelectric conversion region of the substrate, and a second floating diffusion region spaced apart from the first floating diffusion region; forming a first recess spaced apart from the first floating diffusion region and the second floating diffusion region by removing a portion of the substrate from a first surface of the substrate; filling the first recess to form a dual conversion gain (DCG) gate that extends perpendicularly or substantially perpendicularly from the first surface of the substrate; and forming a conductive layer to fill an inside of the first recess.

The forming the recess may include forming the recess to have a bottom surface with a rounded corner.

The rounded corner may form an arc having a radius of about 10 nm to about 100 nm.

The rounded corner may form an arc having a radius of about 60 nm to about 100 nm.

The method may further include forming a second recess spaced apart from the first floating diffusion region by removing a portion of the substrate from a first surface of the substrate.

The filling the first recess may include filling the first recess and the second recess to form the DCG gate.

The method may further include filling the second recess to form a transfer gate.

The method may further include forming a transfer gate over the substrate between the photoelectric conversion region and the first floating diffusion region.

The method may further include forming a first dielectric layer on the first surface of the substrate and a surface of the first recess, wherein the filling the first recess may include filling the first recess to form the DCG gate on the first dielectric layer.

The method may further include forming a second dielectric layer on the DCG gate.

The method may further include forming a color filter on a second surface of the substrate, opposite the first surface.

The method may further include forming a micro lens on the color filter.

The method may further include forming a color filter on the second dielectric layer.

The method may further include forming a micro lens on the color filter.

The method may further include forming an isolation region to extend vertically or substantially vertically from the first surface and defining a unit pixel area including the photoelectric conversion region, the first floating diffusion region, the second floating diffusion region, and the DCG gate.

The isolation region may include a dielectric material having a refractive index that is less than a refractive index of the substrate.

The forming the recess may include removing the portion of the substrate to a depth in the substrate that is greater than half of a depth of the first floating diffusion region and half of a depth of the second floating diffusion region.

The forming the recess may include removing the portion of the substrate to a depth that is less than half of a depth of the first floating diffusion region and half of a depth of the second floating diffusion region.

The forming the recess may include removing the portion of the substrate to a depth that is less than a depth of the first floating diffusion region and a depth of the second floating diffusion region.

The forming the recess may include forming the recess between the first floating diffusion region and the second floating diffusion region.

According to an aspect of another exemplary embodiment, there is provided a unit pixel of an image sensor, the unit pixel including: a substrate; a photoelectric conversion region in the substrate and configured to generate a photo-charge according to incident light; a first floating diffusion region in the substrate, spaced apart from the photoelectric conversion region, and configured to receive the photo-charge from the photoelectric conversion region; a transfer gate over the substrate between the photoelectric conversion region and the first floating diffusion region; a second floating diffusion region in the substrate, spaced apart from the first floating diffusion region; and a dual conversion gain (DCG) gate spaced apart from the first floating diffusion region and the second floating diffusion region, and extending perpendicularly or substantially perpendicularly into the substrate with respect to a first surface of the substrate, wherein the transfer gate is configured to transfer the photo-charge from the photoelectric conversion region to the first floating diffusion region. wherein the DCG gate is configured to transfer the generated photo-charge from the first floating diffusion region to the second floating diffusion region.

The DCG gate may be between the first floating diffusion region and the second floating diffusion region.

The DCG gate may include: a first bottom portion that extends perpendicularly or substantially perpendicularly into the substrate with respect to the first surface; and a top portion that is on the first surface and is connected to the first bottom portion.

The first bottom portion may include a flat bottom surface with a rounded corner.

The rounded corner may form an arc with a radius of about 10 nm to about 100 nm.

The rounded corner may form an arc with a radius of about 60 nm to about 100 nm.

The DCG gate may further include a second bottom portion extending perpendicularly or substantially perpendicularly into the substrate with respect to the first surface, and the top portion may be connected to the first bottom portion and the second bottom portion.

The unit pixel may further include a first dielectric layer on the first surface of the substrate and a surface of the recess, wherein the DCG gate may be formed on the first dielectric layer.

The unit pixel may further include a second dielectric layer on the DCG gate.

The unit pixel may further include a color filter on a second surface of the substrate, opposite the first surface.

The unit pixel may further include a micro lens on the color filter.

The unit pixel may further include a color filter on the second dielectric layer.

The unit pixel may further include a micro lens on the color filter.

A depth of the first bottom portion extending perpendicularly or substantially perpendicularly into the substrate may be less than a depth of the first floating diffusion region and less than a depth of the second floating diffusion region.

The DCG gate may be configured to transfer the photo-charge from the first floating diffusion region to the second floating diffusion region in response to a first control signal.

According to an aspect of another exemplary embodiment, there is provided an image sensor including: a pixel array including a plurality of unit pixels configured to generate a plurality of pixel signals according to incident light; and a signal processor configured to generate image data based on the generated plurality of pixel signals, wherein a unit pixel among the plurality of unit pixels of the pixel array includes: a substrate; a photoelectric conversion region in the substrate and configured to generate a photo-charge according to incident light; a first floating diffusion region in the substrate, spaced apart from the photoelectric conversion region, and configured to receive the photo-charge from the photoelectric conversion region; a transfer gate over the substrate between the photoelectric conversion region and the first floating diffusion region, configured to transfer the generated photo-charge from the photoelectric conversion region to the first floating diffusion region; a second floating diffusion region in the substrate, spaced apart from the first floating diffusion region; and a dual conversion gain (DCG) gate spaced apart from the first floating diffusion region and the second floating diffusion region, extending perpendicularly or substantially perpendicularly into the substrate with respect to a first surface of the substrate, and configured to transfer the generated photo-charge from the first floating diffusion region to the second floating diffusion region.

The DCG gate may be between the first floating diffusion region and the second floating diffusion region.

The signal processor may control the DCG gate to transfer the photo-charge from the first floating diffusion region to the second floating diffusion region in a first operation mode, and deactivate the DCG gate from transferring the photo-charge from the first floating diffusion region to the second floating diffusion region in a second operation mode.

The signal processor may include an operation mode detector that determines an operation mode, from among at least the first operation mode and the second operation mode, according to an illuminance of the incident light.

The signal processor may include an operation mode detector that determines the first operation mode in response to an illuminance of the incident light being greater than a reference illuminance, and determines the second operation mode in response to the illuminance of the incident light being less than the reference illuminance.

The signal processor may determine an operation mode, from among at least the first operation mode and the second operation mode, according to a user setting value.

According to an aspect of another exemplary embodiment, there is provided a portable electronic device including: an application processor; and an image sensor configured to generate image data according to a control of the application processor, the image sensor including: a pixel array comprising a plurality of unit pixels configured to generate a plurality of pixel signals according to incident light, and a signal processor configured to generate image data based on the generated plurality of pixel signals, wherein a unit pixel among the plurality of unit pixels of the pixel array includes: a substrate; a photoelectric conversion region in the substrate and configured to generate a photo-charge according to incident light; a first floating diffusion region in the substrate, spaced apart from the photoelectric conversion region, and configured to receive the photo-charge from the photoelectric conversion region; a transfer gate over the substrate between the photoelectric conversion region and the first floating diffusion region, configured to transfer the generated photo-charge from the photoelectric conversion region to the first floating diffusion region; a second floating diffusion region in the substrate, spaced apart from the first floating diffusion region; and a dual conversion gain (DCG) gate between the first floating diffusion region and the second floating diffusion region, extending perpendicularly or substantially perpendicularly into the substrate with respect to a first surface of the substrate, and configured to transfer the generated photo-charge from the first floating diffusion region to the second floating diffusion region.

The portable electronic device may further include a dynamic random access memory (DRAM).

The portable electronic device may further include a display device, wherein the display device is configured to communicate with the image sensor via the application processor.

BRIEF DESCRIPTION OF THE DRAWINGS

Illustrative, non-limiting exemplary embodiments will be more clearly understood from the following detailed description taken in conjunction with the accompanying drawings.

DETAILED DESCRIPTION OF EXEMPLARY EMBODIMENTS

Figure 1:
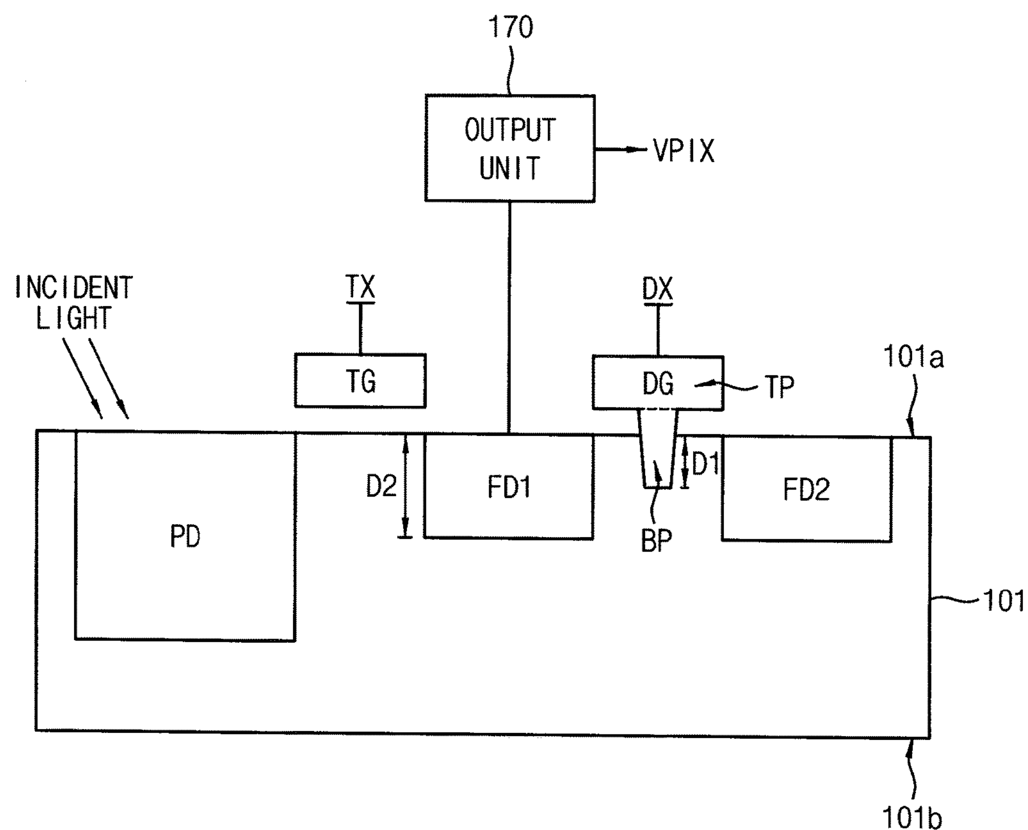
FIG. 1 is a cross-sectional view illustrating a unit pixel of an image sensor according to an exemplary embodiments.

Various exemplary embodiments will be described more fully with reference to the accompanying drawings. An exemplary embodiment may, however, be embodied in many different forms and should not be construed as limited to exemplary embodiments set forth herein. Rather, these exemplary embodiments are provided so that this disclosure will be thorough and complete, and will fully convey the scope of the inventive concept to those skilled in the art. Like reference numerals refer to like elements throughout this application.

It will be understood that, although the terms first, second, etc., may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term “and/or” includes any and all combinations of one or more of the associated listed items.

It will be understood that when an element is referred to as being “connected” or “coupled” to another element, it can be directly connected or coupled to the other element or intervening elements may be present. In contrast, when an element is referred to as being “directly connected” or “directly coupled” to another element, there are no intervening elements present. Other words used to describe the relationship between elements should be interpreted in a like fashion (e.g., “between” versus “directly between,” “adjacent” versus “directly adjacent,” etc.).

The terminology used herein is for the purpose of describing particular exemplary embodiments and is not intended to be limiting of the inventive concept. As used herein, the singular forms “a,” “an,” and “the” are intended to include the plural forms as well, unless the context clearly indicates otherwise. It will be further understood that the terms “comprises,” “comprising,” “includes” and/or “including,” when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An image sensor is a semiconductor device that transforms incident light into an electric signal. A charge coupled device (CCD) image sensor and a complementary metal oxide semiconductor (CMOS) image sensor are examples of different types of image sensors. Hereinafter, an image sensor according to exemplary embodiments will be described based on the CMOS image sensor. However, it is understood that one or more other exemplary embodiments are not limited thereto. For example, the image sensor according to one or more other exemplary embodiments may be applied to any image sensor, such as the CCD image sensor.

FIG. 1 is a cross-sectional view illustrating a unit pixel 100 of an image sensor according to an exemplary embodiment.

Referring to FIG. 1, a unit pixel 100 of an image sensor includes a photoelectric conversion region PD, a first floating diffusion region FD1, a transfer gate TG, a second floating diffusion region FD2, and a dual conversion gain (DCG) gate DG that are formed in or over a semiconductor substrate 101. The unit pixel 100 of the image sensor may further include an output unit 170.

The semiconductor substrate 101 may have a first surface 101*a* and a second surface 101*b* that corresponds to the first surface 101*a*. For example, the semiconductor substrate 101 may include an epitaxial layer.

The photoelectric conversion region PD is formed (i.e., provided) in the semiconductor substrate 101. The photoelectric conversion region PD collects photo-charges based on incident light. For example, electron-hole pairs may be generated in response to the incident light, and the photoelectric conversion region PD may collect the electrons or the holes of the electron-hole pairs.

Although FIG. 1 illustrates the photoelectric conversion region PD as a photodiode, the photoelectric conversion region PD may include at least one of a photodiode (e.g., a silicon photodiode, an organic photodiode, etc.), a photo transistor, a photo gate, a pinned photodiode (PPD).

The first floating diffusion region FD1 is formed in the semiconductor substrate 101 and is spaced apart from the photoelectric conversion region PD. The transfer gate TG is formed over the semiconductor substrate 101 between the photoelectric conversion region PD and the first floating diffusion region FD1.

The transfer gate TG receives a transfer control signal TX, and the photo-charges that are collected by the photoelectric conversion region PD are transferred to the first floating diffusion region FD1 based on the transfer control signal TX received by the transfer gate TG. In other words, the transfer gate TG may provide a structure for transferring the photo-charges from the photoelectric conversion region PD to the first floating diffusion region FD1 (e.g., based on a bias voltage). For example, the photoelectric conversion region PD and the first floating diffusion region FD1 may be electrically connected to each other in response to the transfer control signal TX (e.g., having a high state). Such an electrical connection may be a channel that is formed in the semiconductor substrate 101 between the two regions PD and FD1. According to various exemplary embodiments, the channel may be a surface channel or a buried channel.

The second floating diffusion region FD2 is formed in the semiconductor substrate 101 and is spaced apart from the photoelectric conversion region PD and the first floating diffusion region FD1. The DCG gate DG extends vertically or substantially vertically with respect to the first surface 101*a* of the semiconductor substrate 101 (i.e., perpendicularly or substantially perpendicularly with respect to the first surface 101*a*) to be adjacent to the first floating diffusion region FD1 and the second floating diffusion region FD2. In other words, the DCG gate DG may have a vertical gate structure that is formed between the first floating diffusion region FD1 and the second floating diffusion region FD2.

The DCG gate DG receives a DCG control signal DX, and the photo-charges are selectively transferred to the second floating diffusion region FD2 based on the DCG control signal DX received by the DCG gate DG. In other words, the DCG gate DG may provide a structure for transferring the photo-charges from the photoelectric conversion region PD through the first floating diffusion region FD1 to the second floating diffusion region FD2. For example, as described above, the photoelectric conversion region PD and the first floating diffusion region FD1 may be electrically connected to each other in response to the transfer control signal TX received by the transfer gate TG, and the first floating diffusion region FD1 and the second floating diffusion region FD2 may also be electrically connected to each other in response to the DCG control signal DX received by the DCG gate DG. Such electrical connection may be a channel that is formed in the semiconductor substrate 101 between the two regions FD1 and FD2.

The output unit 170 may be connected to the first floating diffusion region FD1. The output unit 170 may generate a pixel signal VPIX corresponding to the incident light based on the photo-charges. As described above, the first floating diffusion region FD1 may receive the photo-charges by the operation of the transfer gate TG, and the second floating diffusion region FD2 may receive the photo-charges by the operations of the transfer gate TG and the DCG gate DG. The output unit 170 may generate or output the pixel signal VPIX corresponding to image data based on the amount of the photo-charges that are transferred to the first floating diffusion region FD1 or based on the amount of the photo-charges that are transferred to the first floating diffusion region FD1 and the second floating diffusion region FD2.

According to one or more other exemplary embodiments, the unit pixel 100 may further include a dielectric capping layer on one or more of the gate structures TG and DG, and/or dielectric spacers that cover sidewalls of one or more of the gate structures TG and DG.

According to various exemplary embodiments, the DCG control signal DX may be selectively activated based on illuminance of the incident light or based on a user setting signal that is externally provided. In a readout mode of the unit pixel 100 of the image sensor, only the first floating diffusion region FD1, from among the first floating diffusion region FD1 and the second floating diffusion region FD2, may be used as a storage for the photo-charges when the DCG control signal DX is deactivated (e.g., the DCG control signal DX has a low state), or both the first floating diffusion region FD1 and the second floating diffusion region FD2 may be used as the storage for the photo-charges when the DCG control signal DX is activated (e.g., the DCG control signal DX has a high state). In the readout mode, a capacitance associated with the storage for the photo-charges (e.g., a capacitance associated with the floating diffusion region) may be adjusted based on whether the DCG control signal DX is activated. A conversion gain of the unit pixel 100, which represents an efficiency of the unit pixel 100 to convert the photo-charges into the pixel signal VPIX, may be determined based on the capacitance associated with the floating diffusion region, and thus the conversion gain of the unit pixel 100 may be effectively adjusted based on whether the DCG control signal DX is activated. An operation of the unit pixel 100 based on whether the DCG control signal DX is activated will be described in detail below with reference to FIGS. 6A, 6B, 10A and 10B.

In one or more exemplary embodiments, as illustrated with a dotted line in FIG. 1, the DCG gate DG may be divided into a top portion TP and at least one bottom portion BP. The at least one bottom portion BP may be formed in the semiconductor substrate 101 and may be surrounded by the semiconductor substrate 101. The top portion TP may be formed over the first surface 101*a* of the semiconductor substrate 101 and may be connected to the at least one bottom portion BP. The top portion TP and the at least one bottom portion BP may be formed simultaneously, using the same or similar processes (e.g., a deposition process and/or a patterning process, etc.). The at least one bottom portion BP may have various structures, and examples of the at least one bottom portion BP will be described in detail with reference to FIGS. 2 and 3.

In one or more exemplary embodiments, the at least one bottom portion BP of the DCG gate DG may have a depth that is less than depths of the first floating diffusion region FD1 and the second floating diffusion region FD2. For example, a depth D1, which represents a distance from the first surface 101*a* of the semiconductor substrate 101 to an end surface of the at least one bottom portion BP, may be shallower than a depth D2, which represents a distance from the first surface 101*a* of the semiconductor substrate 101 to an end surface of the first floating diffusion region FD1 or a distance from the first surface 101*a* of the semiconductor substrate 101 to an end surface of the second floating diffusion region FD2. While in the present exemplary embodiment, the depth D2 of the first floating diffusion region FD1 is the same as or similar to the depth D2 of the second floating diffusion region FD2, it is understood that one or more other exemplary embodiments are not limited thereto, and the first floating diffusion region FD1 and the second floating diffusion region FD2 may have different depths. The channel (i.e., electrical connection between the first floating diffusion region FD1 and the second floating diffusion region FD2) may be formed within a region, which is located in the semiconductor substrate 101 under the at least one bottom portion BP and between the first and second floating diffusion regions FD1 and FD2, in response to the DCG control signal DX received by the DCG gate DG.

The unit pixel 100 of the image sensor according to exemplary embodiments includes the DCG gate DG that extends vertically (i.e., perpendicularly) or substantially vertically with respect to the first surface 101*a* of the semiconductor substrate 101 to be adjacent to the first floating diffusion region FD1 and the second floating diffusion region FD2. Since the DCG gate DG may have the vertical gate structure, a surface area of the DCG gate DG that contacts with the semiconductor substrate 101 may be increased. In comparison with a related art unit pixel that includes a DCG gate having a planar gate structure, the unit pixel 100 may have a relatively large capacitance associated with the storage (e.g., the floating diffusion region of the unit pixel 100) for the photo-charges when the DCG control signal DX is activated in the readout mode. Accordingly, a conversion gain of the unit pixel 100 may be effectively adjusted based on the DCG control signal DX without a decrease in an area of the photoelectric conversion region PD (e.g., without a decrease in a fill factor).

Figure 2:
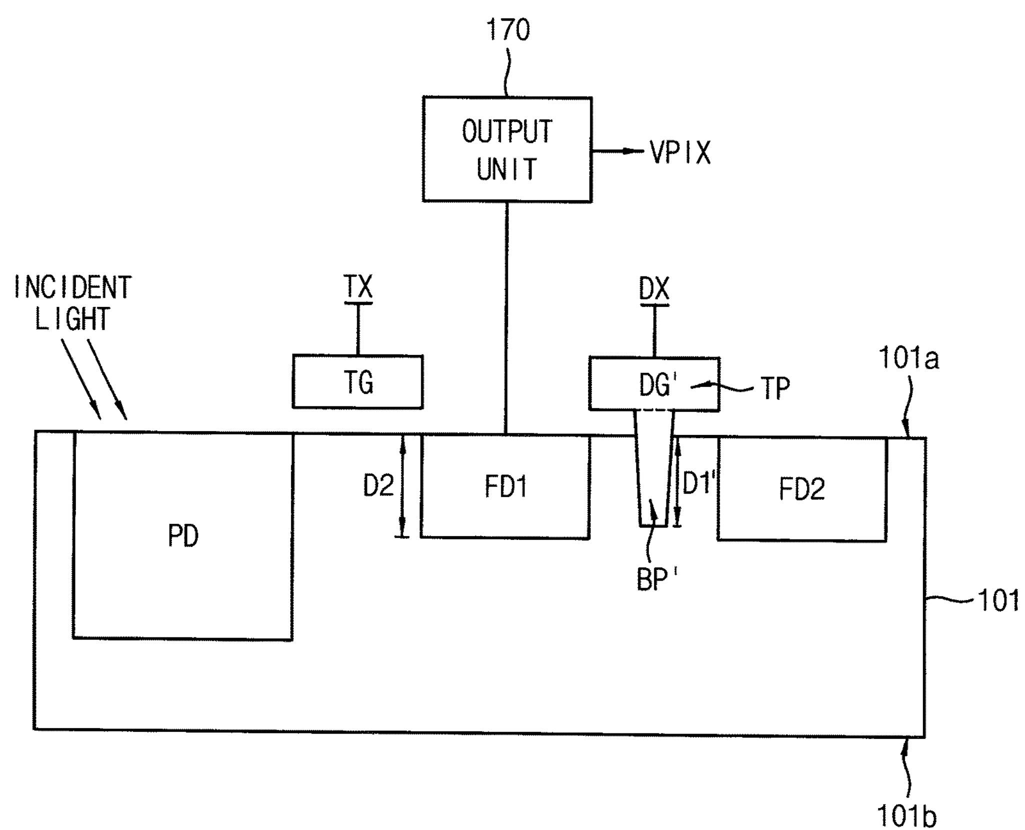
FIGS. 2 and 3 are cross-sectional views illustrating unit pixels of image sensors according to other exemplary embodiments.
Figure 3:
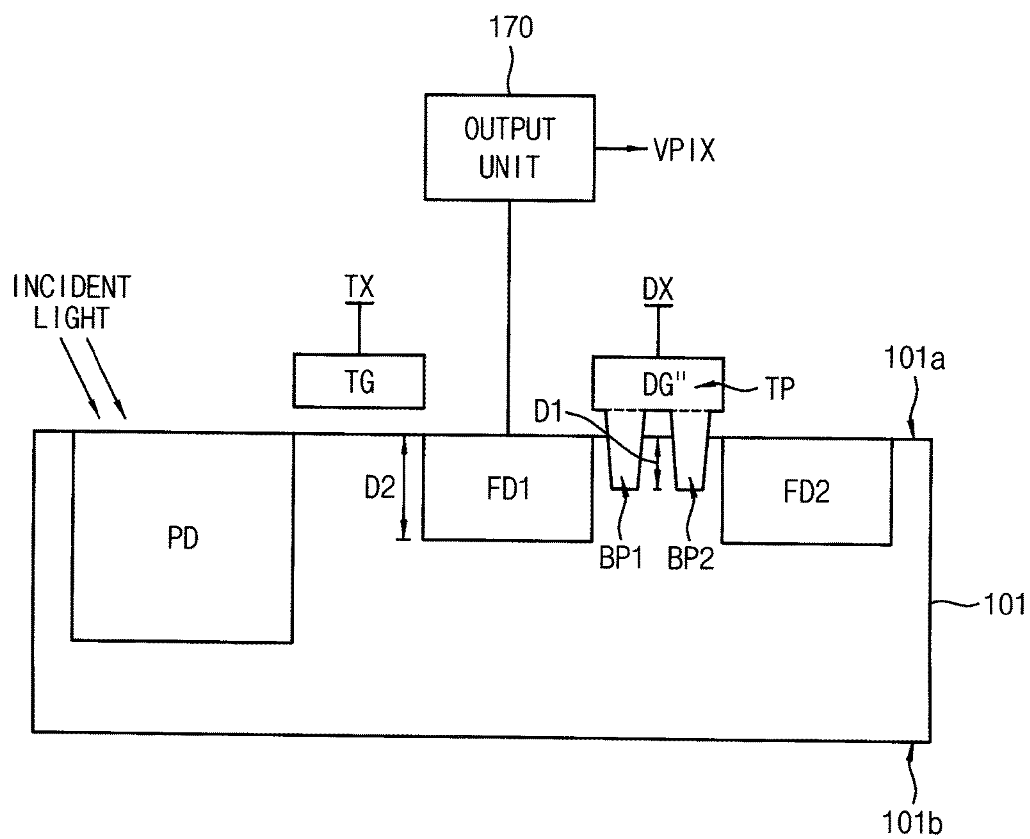

FIGS. 2 and 3 are cross-sectional views illustrating unit pixels 100*a* and 100*b* of image sensors according to other exemplary embodiments.

Referring to FIG. 2, a unit pixel 100*a* of an image sensor includes a photoelectric conversion region PD, a first floating diffusion region FD1, a transfer gate TG, a second floating diffusion region FD2, and a DCG gate DG' that are formed in or over a semiconductor substrate 101. The unit pixel 100*a* of the image sensor may further include an output unit 170.

The photoelectric conversion region PD, the first floating diffusion region FD1, the second floating diffusion region FD2, the transfer gate TG, and the output unit 170 in FIG. 2 may be substantially the same as or similar to the photoelectric conversion region PD, the first floating diffusion region FD1, the second floating diffusion region FD2, the transfer gate TG and the output unit 170 in FIG. 1, respectively.

The DCG gate DG' extends vertically (i.e., perpendicularly) or substantially vertically with respect to a first surface 101*a* of the semiconductor substrate 101 to be adjacent to the first floating diffusion region FD1 and the second floating diffusion region FD2. The DCG gate DG' may be divided into a top portion TP and at least one bottom portion BP'. The at least one bottom portion BP' in FIG. 2 may be relatively deeply formed. In other words, the at least one bottom portion BP' of the DCG gate DG' in FIG. 2 may be deeper than the at least one bottom portion BP of the DCG gate DG in FIG. 1.

In one or more exemplary embodiments, a conversion gain of the unit pixel 100, 100*a* may be reduced as the depth of the at least one bottom portion BP, BP' of the DCG gate DG, DG' is increased. For example, a depth D1', which represents a distance from the first surface 101*a* of the semiconductor substrate 101 to an end surface of the at least one bottom portion BP' in FIG. 2, may be deeper than the depth D1, which represents the distance from the first surface 101*a* of the semiconductor substrate 101 to the end surface of the at least one bottom portion BP in FIG. 1. A surface area of the DCG gate DG' in FIG. 2 that contacts with the semiconductor substrate 101 may be greater than the surface area of the DCG gate DG in FIG. 1 that contacts with the semiconductor substrate 101. When the DCG control signal DX is activated in the readout mode, a capacitance associated with the floating diffusion region of the unit pixel 100*a* of FIG. 2 may be greater than the capacitance associated with the floating diffusion region of the unit pixel 100 of FIG. 1. As will be described with reference to FIGS. 6A and 6B, since the conversion gain of the unit pixel 100, 100*a* may be inversely proportional to the capacitance associated with the floating diffusion region of the unit pixel 100, 100*a*, the conversion gain of the unit pixel 100*a* of FIG. 2 may be less than the conversion gain of the unit pixel 100 of FIG. 1 when the DCG control signal DX is activated in the readout mode.

As described above with reference to FIGS. 1 and 2, the depth of the at least one bottom portion BP, BP' of the vertical DCG gate DG, DG' included in the unit pixel 100, 100*a* according to exemplary embodiments may be varied in a range within (e.g., be less than) the depths of the first floating diffusion region FD1 and the second floating diffusion region FD2. In some exemplary embodiments, the depth of the first floating diffusion region FD1 may be different from the depth of the second floating diffusion region FD2, and then the depth of the at least one bottom portion BP, BP' of the vertical DCG gate DG, DG' may be less than a smaller one of the depths of the first floating diffusion region FD1 and the second floating diffusion region FD2.

Although not illustrated in FIGS. 1 and 2, according to one or more other exemplary embodiments, the depth of the at least one bottom portion of the vertical DCG gate may be equal to or greater than the depths of the first floating diffusion region FD1 and the second floating diffusion region FD2.

Referring to FIG. 3, a unit pixel 100*b* of an image sensor according to still another exemplary embodiment includes a photoelectric conversion region PD, a first floating diffusion region FD1, a transfer gate TG, a second floating diffusion region FD2 and a DCG gate DG" that are formed in or over a semiconductor substrate 101. The unit pixel 100*b* of the image sensor may further include an output unit 170.

The photoelectric conversion region PD, the first floating diffusion region FD1, the second floating diffusion region FD2, the transfer gate TG and the output unit 170 in FIG. 3 may be substantially the same as or similar to the photoelectric conversion region PD, the first and second floating diffusion regions FD1 and FD2, the transfer gate TG and the output unit 170 in FIG. 1, respectively.

The DCG gate DG" extends vertically (i.e., perpendicularly) or substantially vertically with respect to a first surface 101*a* of the semiconductor substrate 101 to be adjacent to the first floating diffusion region FD1 and the second floating diffusion region FD2. The DCG gate DG" may be divided into a plurality of bottom portions BP1 and BP2 and a top portion TP.

In one or more exemplary embodiments, a conversion gain of the unit pixel 100, 100*a*, 100*b* may be reduced as the number of the bottom portions BP, BP', BP1, BP2 of the DCG gate DG, DG', DG" is increased. For example, the DCG gate DG" in FIG. 3 may include two bottom portions BP1 and BP2, and the DCG gate DG in FIG. 1 may include one bottom portion BP. A surface area of the DCG gate DG" in FIG. 3 that contacts with the semiconductor substrate 101 may be greater than the surface area of the DCG gate DG in FIG. 1 that contacts with the semiconductor substrate 101. When the DCG control signal DX is activated in the readout mode, a capacitance associated with the floating diffusion region of the unit pixel 100*b* of FIG. 3 may be greater than the capacitance associated with the floating diffusion region of the unit pixel 100 of FIG. 1. As will be described with reference to FIGS. 6A and 6B, since the conversion gain of the unit pixel 100, 100*a*, 100*b* may be inversely proportional to the capacitance associated with the floating diffusion region of the unit pixel 100, 100*a*, 100*b*, the conversion gain of the unit pixel 100*b* of FIG. 3 may be less than the conversion gain of the unit pixel 100 of FIG. 1 when the DCG control signal DX is activated in the readout mode.

As described above with reference to FIGS. 1 and 3, the number of the bottom portions BP, BP1, BP2 of the vertical DCG gate DG, DG" included in the unit pixel 100, 100*b* according to exemplary embodiments may be varied. For example, the vertical DCG gate DG, DG" may include more than three bottom portions. In one or more exemplary embodiments, depths of the bottom portions BP1 and BP2 may be less than the depths of the first floating diffusion region FD1 and the second floating diffusion region FD2.

Although not illustrated in FIGS. 1 and 3, the depth of the bottom portion BP1 may be different from the depth of the bottom portion BP2, and/or the depths of the bottom portions BP1 and BP2 may be equal to or greater than the depths of the first floating diffusion region FD1 and the second floating diffusion region FD2.

In the unit pixel 100 of the image sensor according to one or more exemplary embodiments, impurities included in the semiconductor substrate 101 may have a conductive type different from a conductive type of impurities included in the photoelectric conversion region PD, the first floating diffusion region FD1, and/or the second floating diffusion region FD2. For example, the semiconductor substrate 101 may be doped with p-type impurities. The photoelectric conversion region PD, the first floating diffusion region FD1, and the second floating diffusion region FD2 may be doped with n-type impurities in the semiconductor substrate 101 using, e.g., an ion implantation process. In this case, the photoelectric conversion region PD may collect electrons of electron-hole pairs based on the incident light.

The unit pixel 100 of the image sensor according to one or more exemplary embodiments may further include a dielectric layer that is interposed between the semiconductor substrate 101 and the gate structures TG and DG. For example, the transfer gate TG and the DCG gate DG may be provided by forming a gate conductive layer on the dielectric layer (e.g., on the first surface 101*a* of the semiconductor substrate 101), and by patterning the gate conductive layer. The gate conductive layer may be formed of polysilicon, metal and/or a metal compound. According to one or more exemplary embodiments, the transfer gate TG and the DCG gate DG may be simultaneously formed, e.g., using the same process, or may be sequentially formed, e.g., using different processes. According to one or more exemplary embodiments, the DCG gate DG may be cup-shaped or pillar-shaped. Furthermore, in one or more exemplary embodiments, the transfer gate TG may also have the vertical gate structure.

The unit pixel 100 of the image sensor according to one or more exemplary embodiments may be included in a frontside illuminated image sensor (FIS) or a backside illuminated image sensor (BIS). For example, the first surface 101*a* of the semiconductor substrate 101, where the gate structures TG and DG are formed, may be a front surface of the semiconductor substrate 101, and the second surface 101*b* of the semiconductor substrate 101 corresponding to the first surface 101*a* may be a back surface of the semiconductor substrate 101. As illustrated in FIG. 1, when the unit pixel 100 generates the pixel signal VPIX based on the incident light passing through the front surface of the semiconductor substrate 101, the unit pixel may 100 be included in the FIS. Although not illustrated in FIGS. 1, 2 and 3, when the unit pixel 100 generates the pixel signal VPIX based on the incident light passing through the back surface of the semiconductor substrate 101, the unit pixel 100 may be included in the BIS.

The unit pixel 100 of the image sensor according to one or more exemplary embodiments may further include a color filter and a micro lens through which the incident light passes. In one or more exemplary embodiments, the color filter and the micro lens may be formed on the front surface of the semiconductor substrate 101 when the unit pixel 100 is included in the FIS. In one or more other exemplary embodiments, the color filter and the micro lens may be formed under the back surface of the semiconductor substrate 101 when the unit pixel 100 is included in the BIS. The unit pixel 100 of the image sensor according to one or more exemplary embodiments may further include an isolation region that is formed vertically (i.e., perpendicularly) or substantially vertically with respect to the first surface 101*a* of the semiconductor substrate 101 and surrounds the photoelectric conversion region PD. According to one or more exemplary embodiments, the isolation region may be a shallow trench isolation (STI) region or a deep trench isolation (DTI) region.

According to one or more exemplary embodiments, the unit pixel 100 of the image sensor may have a five-transistor structure that includes a reset transistor, a transfer transistor, a floating diffusion node and a DCG transistor, and/or a structure where some transistors are shared by a plurality of unit pixels 100. The circuitry of the unit pixel 200 according to one or more exemplary embodiments will be described with reference to FIGS. 4 and 7.

Figure 4:
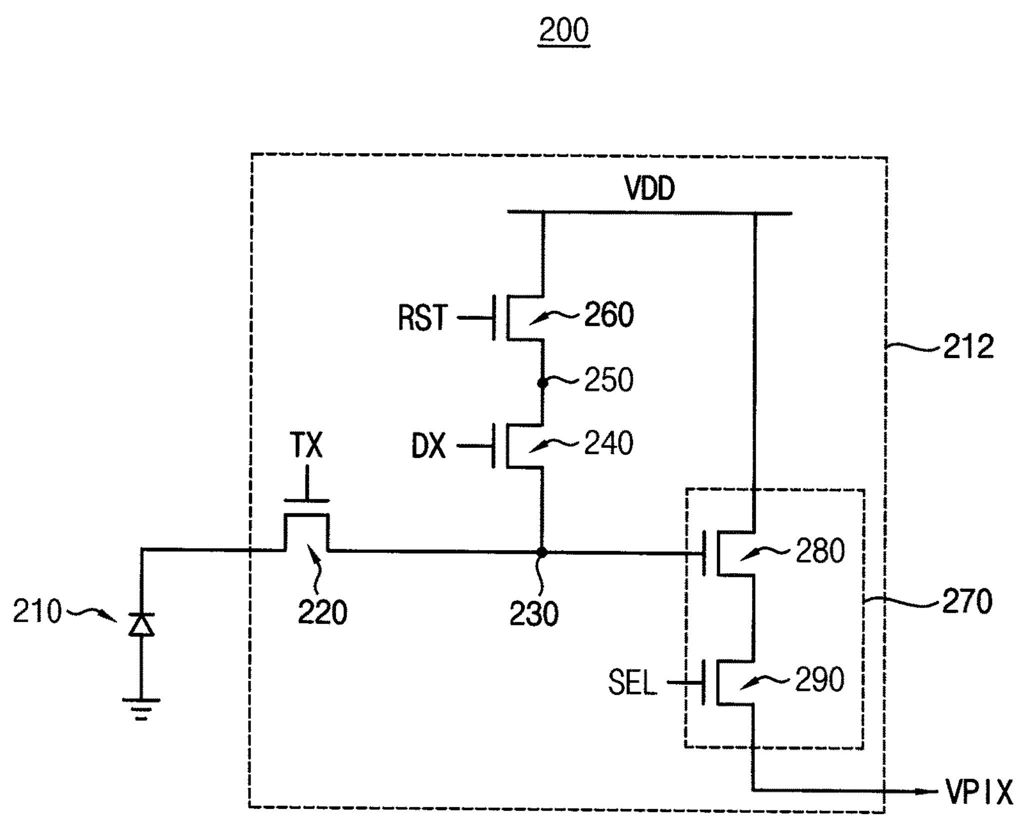
FIG. 4 is a circuit diagram of a unit pixel according to an exemplary embodiment.

FIG. 4 is a circuit diagram of a unit pixel 200 according to an exemplary embodiment. For example, the unit pixel 200 may be an example of the unit pixel 100 described with reference to FIG. 1.

Referring to FIG. 4, a unit pixel 200 of an image sensor may include a photoelectric converter 210 and a signal generating circuit 212.

The photoelectric converter 210 (e.g., photodiode) may perform a photoelectric conversion operation based on incident light. The signal generating circuit 212 may generate a pixel signal VPIX based on photo-charges that are generated by the photoelectric conversion operation. The signal generating circuit 212 may include a transfer transistor 220, a first floating diffusion node 230, a DCG transistor 240, a second floating diffusion node 250, a reset transistor 260, and an output unit 270.

The transfer transistor 220 may include a first electrode (e.g., a drain electrode) connected to the photoelectric converter 210, a second electrode (e.g., a source electrode) connected to the first floating diffusion node 230, and a control electrode (e.g., a gate electrode) receiving a transfer control signal TX. The DCG transistor 240 may include a first electrode connected to the first floating diffusion node 230, a second electrode connected to the second floating diffusion node 250, and a control electrode receiving a DCG control signal DX. The reset transistor 260 may include a first electrode receiving a power supply voltage VDD, a second electrode connected to the second floating diffusion node 250, and a control electrode receiving a reset signal RST. The output unit 270 may be connected to the first floating diffusion region 230, may generate the pixel signal VPIX based on the photo-charges, and may include a drive transistor 280 and a select transistor 290. The drive transistor 280 may include a first electrode receiving the power supply voltage VDD, a control electrode connected to the first floating diffusion node 230, and a second electrode. The select transistor 290 may include a first electrode connected to the second electrode of the drive transistor 280, a control electrode receiving a selection signal SEL (e.g., a row selection signal), and a second electrode outputting the pixel signal VPIX.

Figure 5:
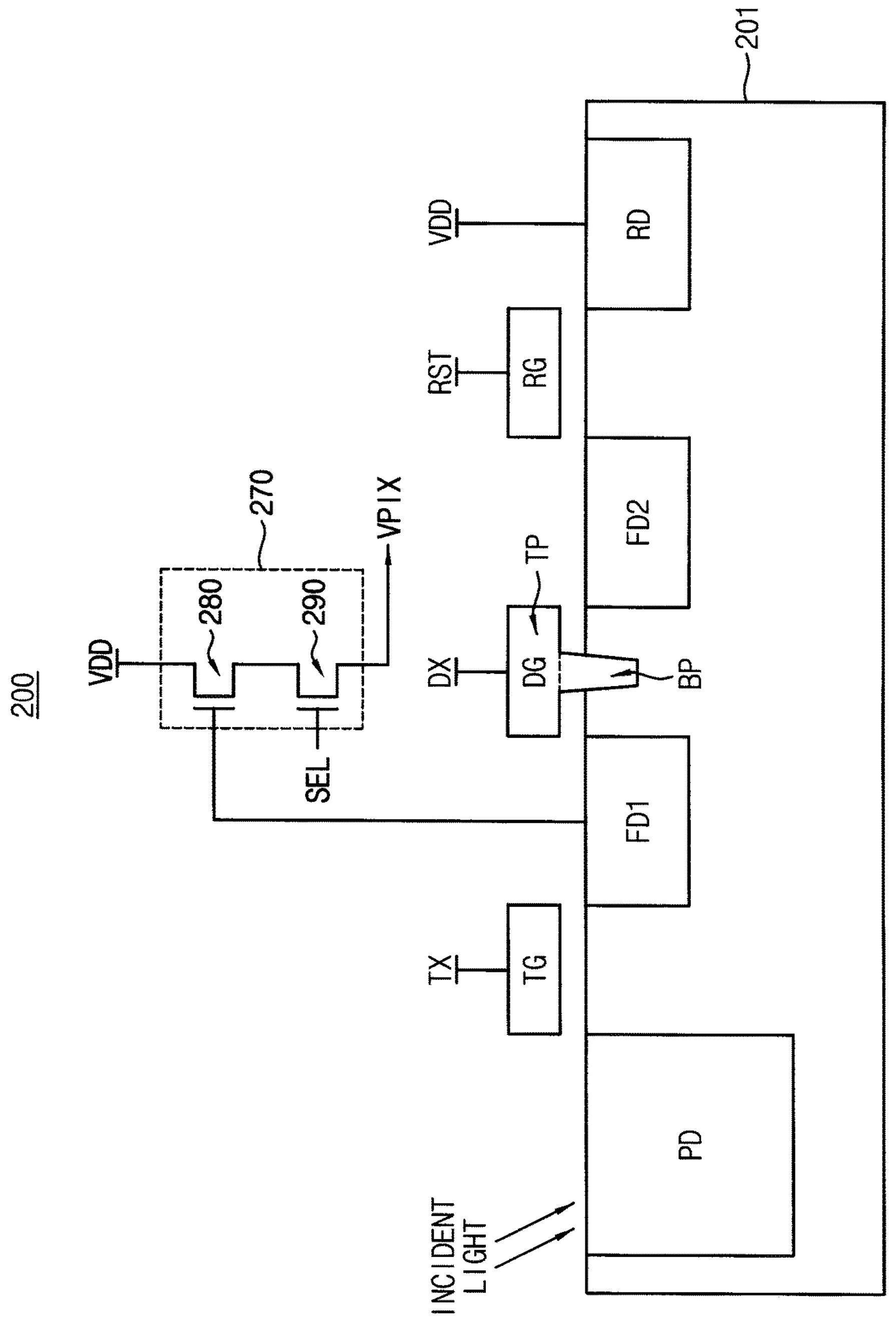
FIG. 5 is a cross-sectional view illustrating a structure of the unit pixel of FIG. 4, according to an exemplary embodiment.

FIG. 5 is a cross-sectional view illustrating a structure of the unit pixel 200 of FIG. 4, according to an exemplary embodiment.

Referring to FIGS. 4 and 5, the unit pixel 200 of the image sensor may include a photoelectric conversion region PD, a first floating diffusion region FD1, a transfer gate TG, a second floating diffusion region FD2, a DCG gate DG, a reset drain region RD, and a reset gate RG that are formed in or over a semiconductor substrate 201. The unit pixel 200 of the image sensor may further include an output unit 270.

The photoelectric conversion region PD, the transfer gate TG, the first floating diffusion region FD1, the DCG gate DG, the second floating diffusion region FD2, the reset gate RG, and the output unit 270 in FIG. 5 may correspond to the photoelectric converter 210, the transfer transistor 220, the first floating diffusion node 230, the DCG transistor 240, the second floating diffusion node 250, the reset transistor 260, and the output unit 270 in FIG. 4, respectively. The photoelectric conversion region PD, the first floating diffusion region FD1, the second floating diffusion region FD2, the transfer gate TG, the DCG gate DG, and the output unit 270 in FIG. 5 may be the same as, substantially the same as, or similar to the photoelectric conversion region PD, the first floating diffusion region FD1, the second floating diffusion region FD2, the transfer gate TG, the DCG gate DG, and the output unit 170 in FIG. 1, respectively.

The reset drain region RD may be formed in the semiconductor substrate 201 and may be spaced apart from the photoelectric conversion region PD, the first floating diffusion region FD1, and the second floating diffusion region FD2. A power supply voltage VDD may be applied to the reset drain region RD.

The reset gate RG may be formed over the semiconductor substrate 201 between the reset drain region RD and the second floating diffusion region FD2. The reset gate RG may receive a reset signal RST, and the first floating diffusion region FD1 and the second floating diffusion region FD2 may be reset based on the reset signal RST. For example, voltage levels of the first floating diffusion region FD1 and the second floating diffusion region FD2 may be reset as a level of the power supply voltage VDD by discharging photo-charges accumulated in the first floating diffusion region FD1 and the second floating diffusion region FD2 in response to the reset signal RST.

In an example of FIGS. 4 and 5, the first floating diffusion node 230, the DCG transistor 240, and the second floating diffusion node 250 may be formed between the transfer transistor 220 and the reset transistor 260. In other words, in the unit pixel 200, the first floating diffusion region FD1 may be formed in the semiconductor substrate 201 between the transfer gate TG and the DCG gate DG, and the second floating diffusion region FD2 may be formed in the semiconductor substrate 201 between the DCG gate DG and the reset gate RG.

Figure 6A:
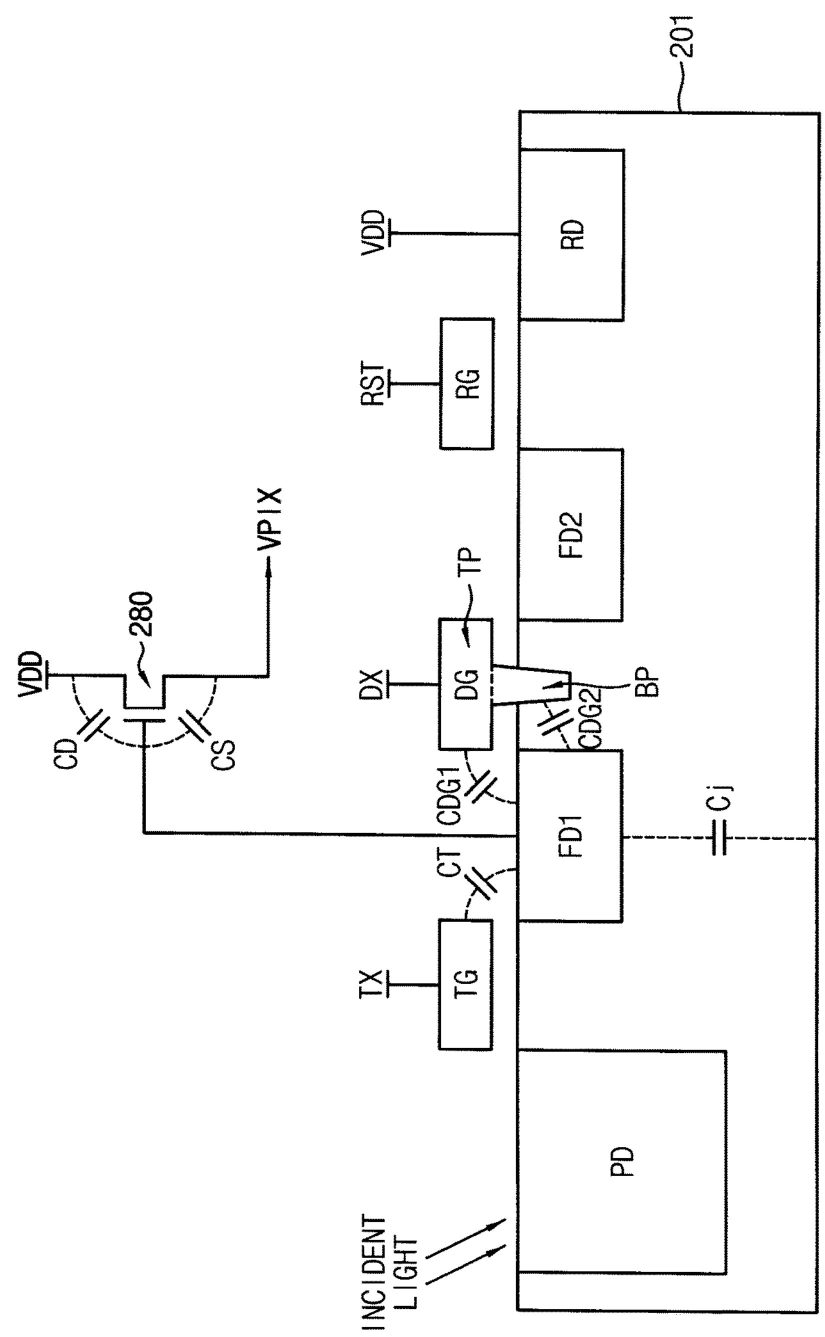
FIGS. 6A and 6B are diagrams for describing an operation of the unit pixel of FIG. 5, according to an exemplary embodiment.
Figure 6B:
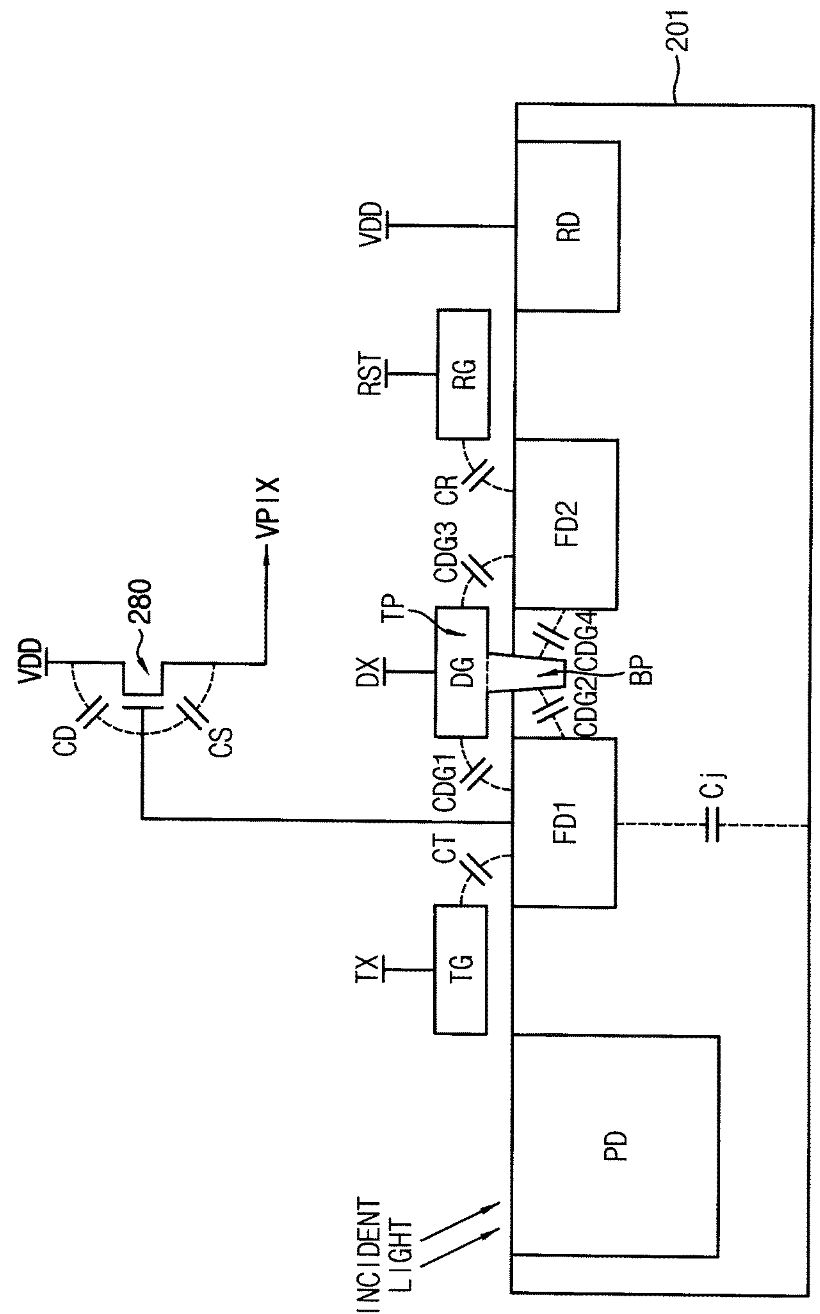

FIGS. 6A and 6B are diagrams for describing an operation of the unit pixel 200 of FIG. 5, according to an exemplary embodiment. In particular, FIG. 6A is a cross-sectional view for describing a conversion gain of the unit pixel 200 of FIG. 5 when the DCG control signal DX is deactivated. Furthermore, FIG. 6B is a cross-sectional view for describing a conversion gain of the unit pixel 200 of FIG. 5 when the DCG control signal DX is activated. For convenience of description, the selection transistor 290 included in the output unit 270 in FIG. 5 are not illustrated in FIGS. 6A and 6B.

In the unit pixel 200 of the image sensor according to one or more exemplary embodiments, the DCG control signal DX may be selectively activated based on the illuminance of the incident light or based on a user setting signal that is externally provided. An example of an image sensor that automatically determines whether the DCG control signal DX is activated based on the illuminance of the incident light and an example of an image sensor that manually determines whether the DCG control signal DX is activated based on the user setting signal will be described in detail with reference to FIGS. 22, 23, 24, and 25.

Referring to FIG. 6A, the DCG control signal DX may be deactivated, e.g., when the illuminance of the incident light is equal to or lower than a reference illuminance, or when the image sensor is set in a low illuminance operation mode based on the user setting signal. In a readout mode of the unit pixel 200 after an integration mode when the DCG control signal DX is deactivated, only the first floating diffusion region FD1 from among the first floating diffusion region FD1 and the second floating diffusion region FD2 may be used as a storage for the photo-charges. In the example of FIG. 6A, a capacitance CFD of the first floating diffusion region FD1 corresponding to the storage for the photo-charges in the readout mode may be represented by Equation 1, and a first conversion gain CG1 of the unit pixel 200 may be represented by Equation 2.

$$CFD = Cj + CT + CDG1 + CDG2 + CD + CS(1 - Gsf) \quad \text{[Equation 1]}$$

$$CG1 = \frac{Q}{CFD} \quad \text{[Equation 2]}$$

In the Equation 1, Cj represents a capacitance between the first floating diffusion region FD1 and the semiconductor substrate 201, CT represents a capacitance between the transfer gate TG and the first floating diffusion region FD1, CDG1 represents a capacitance between the first floating diffusion region FD1 and the top portion TP of the DCG gate DG, CDG2 represents a capacitance between the first floating diffusion region FD1 and the at least one bottom portion BP of the DCG gate DG, CD represents a capacitance between the first electrode and the control electrode of the drive transistor 280, and CS represents a capacitance between the control electrode and the second electrode of the drive transistor 280. Gsf represents a gain of the drive transistor 280, and may correspond to a ratio of an output signal (e.g., the pixel signal VPIX) to an input signal (e.g., a voltage of the first floating diffusion region FD1) of the drive transistor 280. In the Equation 2, Q represents the amount of the photo-charges in the example of FIG. 6A that are collected by the photoelectric conversion region PD in the integration mode and are transferred to the first floating diffusion region FD1 in the readout mode.

Referring to FIG. 6B, the DCG control signal DX may be activated, e.g., when the illuminance of the incident light is higher than the reference illuminance, or when the image sensor is set in a high illuminance operation mode based on the user setting signal. In the readout mode of the unit pixel 200 after the integration mode, both the first floating diffusion region FD1 and the second floating diffusion region FD2 may be used as a storage for the photo-charges. In the example of FIG. 6B, a capacitance CFD' of the first floating diffusion region FD1 and the second floating diffusion region FD2 corresponding to the storage for the photo-charges in the readout mode may be represented by Equation 3, and a second conversion gain CG2 of the unit pixel 200 may be represented by Equation 4.

$$CFD' = Cj + CT + CDG1 + CDG2 + CDG3 + CDG4 + CR + CD + CS(1 - Gsf) \quad \text{[Equation 3]}$$

$$CG2 = \frac{Q'}{CFD'} \quad \text{[Equation 4]}$$

In the Equation 3, CDG3 represents a capacitance between the top portion TP of the DCG gate DG and the second floating diffusion region FD2, CDG4 represents a capacitance between the at least one bottom portion BP of the DCG gate DG and the second floating diffusion region FD2, and CR represents a capacitance between the second floating diffusion region FD2 and the reset gate RG. In the Equation 4, Q' represents the amount of the photo-charges in the example of FIG. 6B that are collected by the photoelectric conversion region PD in the integration mode and are transferred to the first floating diffusion region FD1 and the second floating diffusion region FD2 in the readout mode.

The unit pixel 100, 100*a*, 100*b*, 200 of the image sensor according to various exemplary embodiments may include the DCG gate DG and may selectively activate the DCG control signal DX that is applied to the DCG gate DG. Accordingly, the conversion gain of the unit pixel 100, 100*a*, 100*b*, 200 and the conversion gain of the image sensor may be effectively adjusted based on the operation mode of the image sensor or an environment where the image sensor is actually used. In addition, in the unit pixel 100, 100*a*, 100*b*, 200 of the image sensor according to various exemplary embodiments, the DCG gate DG may have the vertical structure such that the DCG gate DG has a relatively large surface area in contact with the semiconductor substrate 201. Accordingly, in comparison with a related art unit pixel that includes a DCG gate having a planar gate structure, the unit pixel 100, 100*a*, 100*b*, 200 according to various exemplary embodiments may have a relatively large capacitance (e.g., greater by CDG2 and CDG4 in FIG. 6B than the related art unit pixel) associated with the floating diffusion region FD1, FD2 when the DCG control signal DX is activated in the readout mode, and the conversion gain of the unit pixel 100, 100*a*, 100*b*, 200 and the conversion gain of the image sensor may be effectively adjusted.

Figure 7:
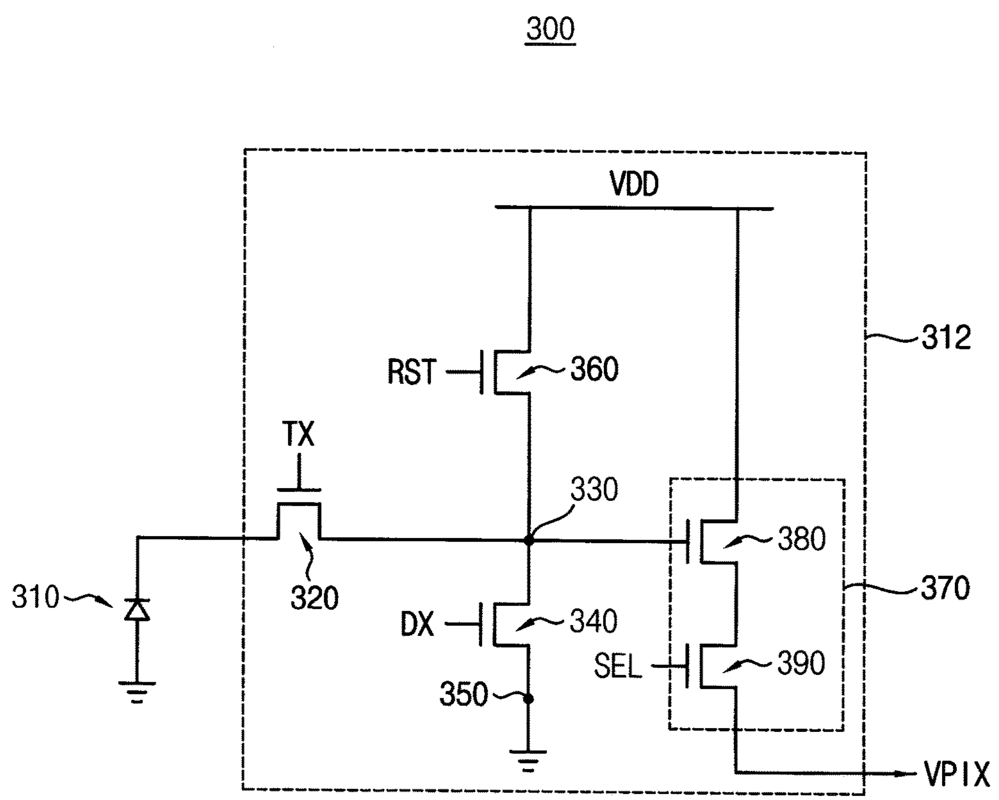
FIG. 7 is a circuit diagram illustrating a unit pixel according to another exemplary embodiment.

FIG. 7 is a circuit diagram illustrating a unit pixel 300 according to another exemplary embodiment. For example, the unit pixel 300 may be an example of the unit pixel 100 described with reference to FIG. 1

Referring to FIG. 7, a unit pixel 300 of an image sensor may include a photoelectric converter 310 and a signal generating circuit 312.

The photoelectric converter 310 (e.g., photodiode) may perform a photoelectric conversion operation based on incident light. The signal generating circuit 312 may generate a pixel signal VPIX based on photo-charges that are generated by the photoelectric conversion operation. The signal generating circuit 312 may include a transfer transistor 320, a first floating diffusion node 330, a DCG transistor 340, a second floating diffusion node 350, a reset transistor 360, and an output unit 370.

The transfer transistor 320 may include a first electrode connected to the photoelectric conversion unit 310, a second electrode connected to the first floating diffusion node 330, and a control electrode receiving a transfer control signal TX. The DCG transistor 340 may include a first electrode connected to the first floating diffusion node 330, a second electrode connected to the second floating diffusion node 350, and a control electrode receiving a DCG control signal DX. The reset transistor 360 may include a first electrode receiving a power supply voltage VDD, a second electrode connected to the first floating diffusion node 330, and a control electrode receiving a reset signal RST. The output unit 370 may be connected to the first floating diffusion region 330, may generate the pixel signal VPIX based on the photo-charges, and may include a drive transistor 380 and a select transistor 390. The drive transistor 380 may include a first electrode receiving the power supply voltage VDD, a control electrode connected to the first floating diffusion node 330, and a second electrode. The select transistor 390 may include a first electrode connected to the second electrode of the drive transistor 380, a control electrode receiving a selection signal SEL, and a second electrode outputting the pixel signal VPIX.

Figure 8:
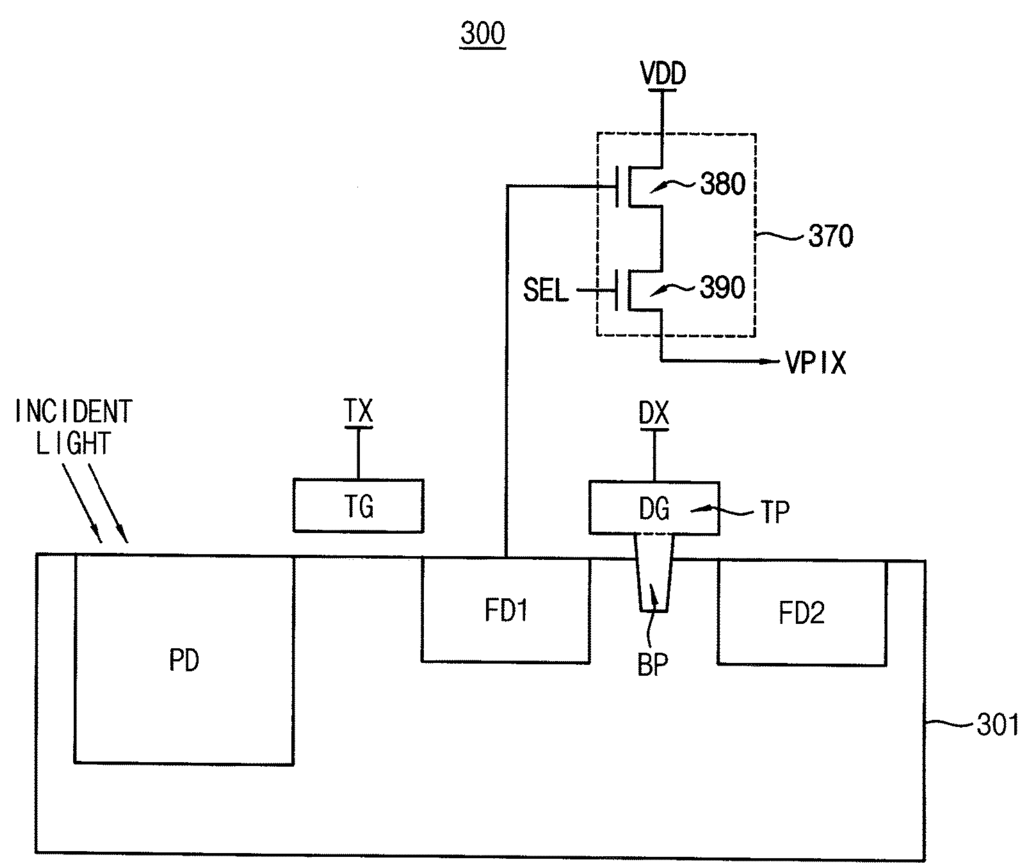
FIGS. 8 and 9 are cross-sectional views illustrating a structure of the unit pixel of FIG. 7, according to an exemplary embodiment.
Figure 9:
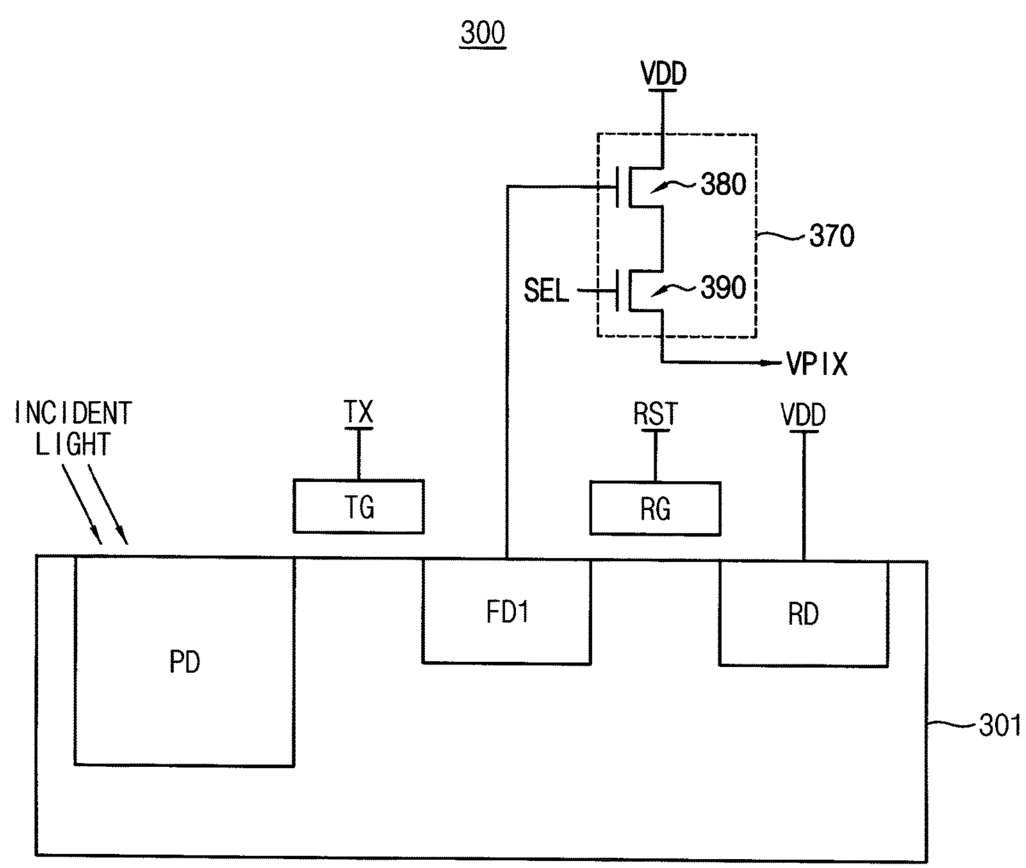

FIGS. 8 and 9 are cross-sectional views illustrating a structure of the unit pixel 300 of FIG. 7, according to an exemplary embodiment.

Referring to FIGS. 7, 8, and 9, the unit pixel 300 of the image sensor may include a photoelectric conversion region PD, a first floating diffusion region FD1, a transfer gate TG, a second floating diffusion region FD2, a DCG gate DG, a reset drain region RD, and a reset gate RG that are formed in or over a semiconductor substrate 301. The unit pixel 300 of the image sensor may further include an output unit 370.

The photoelectric conversion region PD, the transfer gate TG, the first floating diffusion region FD1, the DCG gate DG, the second floating diffusion region FD2, the reset gate RG, and the output unit 370 in FIGS. 8 and 9 may correspond to the photoelectric conversion unit 310, the transfer transistor 320, the first floating diffusion node 330, the DCG transistor 340, the second floating diffusion node 350, the reset transistor 360, and the output unit 370 in FIG. 7, respectively. The photoelectric conversion region PD, the first floating diffusion region FD1, the second floating diffusion region FD2, the transfer gate TG, the DCG gate DG, and the output unit 370 in FIGS. 8 and 9 may be the same as, substantially the same as, or similar to the photoelectric conversion region PD, the first floating diffusion region FD1, the second floating diffusion region FD2, the transfer gate TG, the DCG gate DG, and the output unit 170 in FIG. 1, respectively.

The reset drain region RD may be formed in the semiconductor substrate 301 and may be spaced apart from the photoelectric conversion region PD, the first floating diffusion region FD1, and the second floating diffusion region FD2. A power supply voltage VDD may be applied to the reset drain region RD. The reset gate RG may be formed over the semiconductor substrate 301 between the reset drain region RD and the first floating diffusion region FD1. The reset gate RG may receive a reset signal RST, and the first floating diffusion region FD1 and the second floating diffusion region FD2 may be reset based on the reset signal RST.

In an example of FIGS. 7, 8, and 9, the first floating diffusion node 330 may be formed between the transfer transistor 320 and the reset transistor 360 and may be formed between the transfer transistor 320 and the DCG transistor 340. In other words, in the unit pixel 300, the first floating diffusion region FD1 may be formed in the semiconductor substrate 301 between the transfer gate TG and the DCG gate DG (as illustrated in FIG. 8), and may be formed in the semiconductor substrate 301 between the transfer gate TG and the reset gate RG (as illustrated in FIG. 9).

The unit pixel 300 of FIGS. 7, 8, and 9 may operate similarly to the unit pixel 200 of FIGS. 4 and 5. As described above with reference to FIGS. 6A and 6B, the DCG control signal DX may be selectively activated, and thus the conversion gain of the unit pixel 300 and the conversion gain of the image sensor may be effectively adjusted. In addition, the DCG gate DG may have the vertical structure such that the DCG gate DG has a relatively large surface area in contact with the semiconductor substrate 301, and thus the conversion gain of the unit pixel 300 and the conversion gain of the image sensor may be effectively adjusted.

Figure 10A:
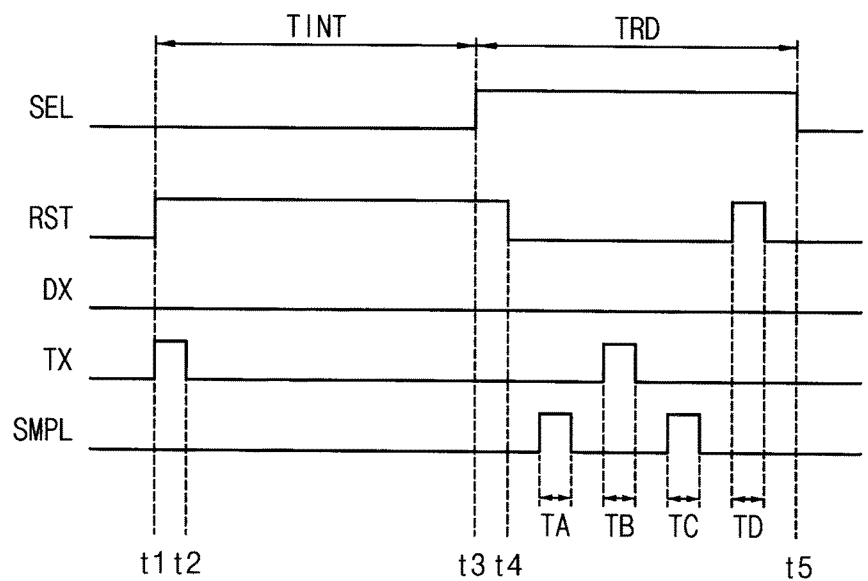
FIGS. 10A and 10B are diagrams for describing an operation of a unit pixel of an image sensor according to one or more exemplary embodiments.
Figure 10B:
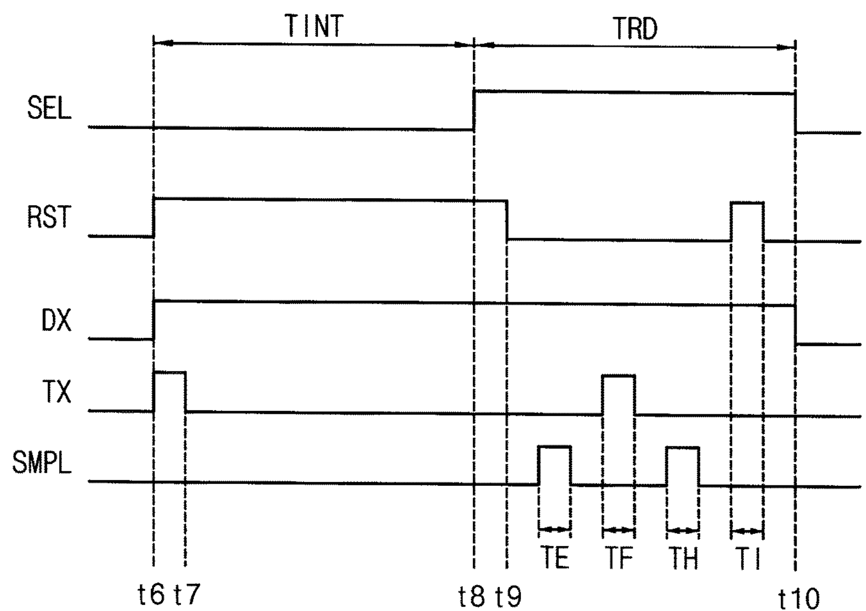

FIGS. 10A and 10B are diagrams for describing an operation of a unit pixel 100, 100*a*, 100*b*, 200, 300 of an image sensor according to one or more exemplary embodiments. FIG. 10A is a timing diagram illustrating an operation of the unit pixel 100, 100*a*, 100*b*, 200, 300 when the DCG control signal DX is deactivated (e.g., when the illuminance of incident light is equal to or lower than a reference illuminance, or when the image sensor is set in a low illuminance operation mode based on a user setting signal). FIG. 10B is a timing diagram illustrating an operation of the unit pixel 100, 100*a*, 100*b*, 200, 300 when the DCG control signal DX is activated (e.g., when the illuminance of the incident light is higher than the reference illuminance, or when the image sensor is set in a high illuminance operation mode based on the user setting signal).

Referring to FIG. 10A, at time t1, the unit pixel 100, 100*a*, 100*b*, 200, 300 of the image sensor starts to operate in an integration mode TINT. The reset signal RST is activated at time t1, the transfer control signal TX is activated during a period from time t1 to time t2, and then the photoelectric conversion region PD and the first floating diffusion region FD1 are reset. The reset signal RST maintains the activation state during the whole integration mode TINT.

During the integration mode TINT after time t2, the photoelectric conversion operation is performed based on the incident light. For example, if the unit pixel 100, 100*a*, 100*b*, 200, 300 according to an exemplary embodiment is included in a CMOS image sensor, image information on an object to be captured may be obtained by collecting charge carriers (e.g., electron-hole pairs) in the photoelectric conversion region PD proportional to an intensity of the incident light through an open shutter of the CMOS image sensor.

At time t3, the integration mode TINT is finished, and the unit pixel 100, 100*a*, 100*b*, 200, 300 of the image sensor starts to operate in a readout mode TRD. The selection signal SEL is activated at time t3, and then the unit pixel 100, 100*a*, 100*b*, 200, 300 for providing the pixel signal VPIX is selected. The reset signal RST is deactivated at time t4. During a period TA after time t4, a sampling signal SMPL is activated, and then a reset component of the pixel signal VPIX is sampled. In an example of FIG. 10A, the reset component of the pixel signal VPIX may correspond to a potential level of the first floating diffusion region FD1 that is reset.

During a period TB after the period TA, the transfer control signal TX is activated, and then the photo-charges are transferred from the photoelectric conversion region PD to the first floating diffusion region FD1. During a period TC after the period TB, the sampling signal SMPL is activated, and then an image component of the pixel signal VPIX is sampled. In the example of FIG. 10A, the image component of the pixel signal VPIX may correspond to a potential level of the first floating diffusion region FD1 that has the photo-charges from the photoelectric conversion region PD. An effective image component may be generated based on the reset component of the pixel signal VPIX and the image component of the pixel signal VPIX.

During a period TD after the period TC, the reset signal RST is activated, and then the first floating diffusion region FD1 is reset. At time t5 after the period TD, the selection signal SEL is deactivated, and then the readout mode TRD is finished.

In the example of FIG. 10A, the DCG control signal DX maintains the deactivation state during the integration mode TINT and during the readout mode TRD. In other words, only the first floating diffusion region FD1 from among the first floating diffusion region FD1 and the second floating diffusion region FD2 is used as a storage for the photo-charges during the readout mode TRD, and the second floating diffusion region FD2 is not used as the storage for the photo-charges during the readout mode TRD. Thus, the unit pixel 100, 100*a*, 100*b*, 200, 300 according to various embodiments may have a relatively large conversion gain when the DCG control signal DX is deactivated in the readout mode TRD.

It is further understood that, if the DCG gate DG and the second floating diffusion region FD2 are formed between the first floating diffusion region FD1 and the reset gate RG (e.g., in the example of FIGS. 4 and 5), the DCG control signal DX may be activated for resetting the first floating diffusion region FD1 during which the reset signal RST is activated (e.g., during the period from time t1 to time t4 and during the period TD).

Referring to FIG. 10B, at time t6, the unit pixel 100, 100*a*, 100*b*, 200, 300 of the image sensor starts to operate in an integration mode TINT. The reset signal RST and the DCG control signal DX are activated at time t6, the transfer control signal TX is activated during a period from time t6 to time t7, and then the photoelectric conversion region PD, the first floating diffusion region FD1, and the second floating diffusion region FD2 are reset. The reset signal RST and the DCG control signal DX maintain the activation state during the whole integration mode TINT. During the integration mode TINT after time t7, the photoelectric conversion operation is performed based on the incident light.

At time t8, the integration mode TINT is finished, and the unit pixel 100, 100*a*, 100*b*, 200, 300 of the image sensor starts to operate in a readout mode TRD. The selection signal SEL is activated at time t8, and then the unit pixel 100, 100*a*, 100*b*, 200, 300 for providing the pixel signal VPIX is selected. The reset signal RST is deactivated at time t9. The DCG control signal DX maintains the activation state during the whole readout mode TRD. During a period TE after time t9, a sampling signal SMPL is activated, and then a reset component of the pixel signal VPIX is sampled. In an example of FIG. 10B, the reset component of the pixel signal VPIX may correspond to a potential level of the first floating diffusion region FD1 and the second floating diffusion region FD2 that are reset.

During a period TF after the period TE, the transfer control signal TX is activated, and then the photo-charges are transferred from the photoelectric conversion region PD to the first floating diffusion region FD1 and the second floating diffusion region FD2. During a period TH after the period TF, the sampling signal SMPL is activated, and then an image component of the pixel signal VPIX is sampled. In the example of FIG. 10B, the image component of the pixel signal VPIX may correspond to a potential level of the first floating diffusion region FD1 and the second floating diffusion region FD2 that have the photo-charges from the photoelectric conversion region PD.

During a period TI after the period TH, the reset signal RST is activated, and then the first floating diffusion region FD1 and the second floating diffusion region FD2 are reset. At time t10 after the period TI, the selection signal SEL and the DCG control signal DX are deactivated, and then the readout mode TRD is finished.

In the example of FIG. 10B, the DCG control signal DX maintains the activation state during the integration mode TINT and during the readout mode TRD. In other words, both the first floating diffusion region FD1 and the second floating diffusion region FD2 are used as a storage for the photo-charges during the readout mode TRD. Thus, the unit pixel 100, 100*a*, 100*b*, 200, 300 according to various exemplary embodiments may have a relatively small conversion gain when the DCG control signal DX is activated in the readout mode TRD.

Furthermore, it is understood that the reset signal RST may only be activated during an initial period of the integration mode TINT (e.g., the period from time t1 to time t2 in FIG. 10A and the period from time t6 to time t7 in FIG. 10B) and during an initial period of the readout mode TRD (e.g., the period from time t3 to time t4 in FIG. 10A and the period from time t8 to time t9 in FIG. 10B).

Hereinafter, various examples of the unit pixel of the image sensor and methods of manufacturing the unit pixel and the image sensor including the unit pixel will be explained in detail with reference to FIGS. 11 through 21.

Figure 11:
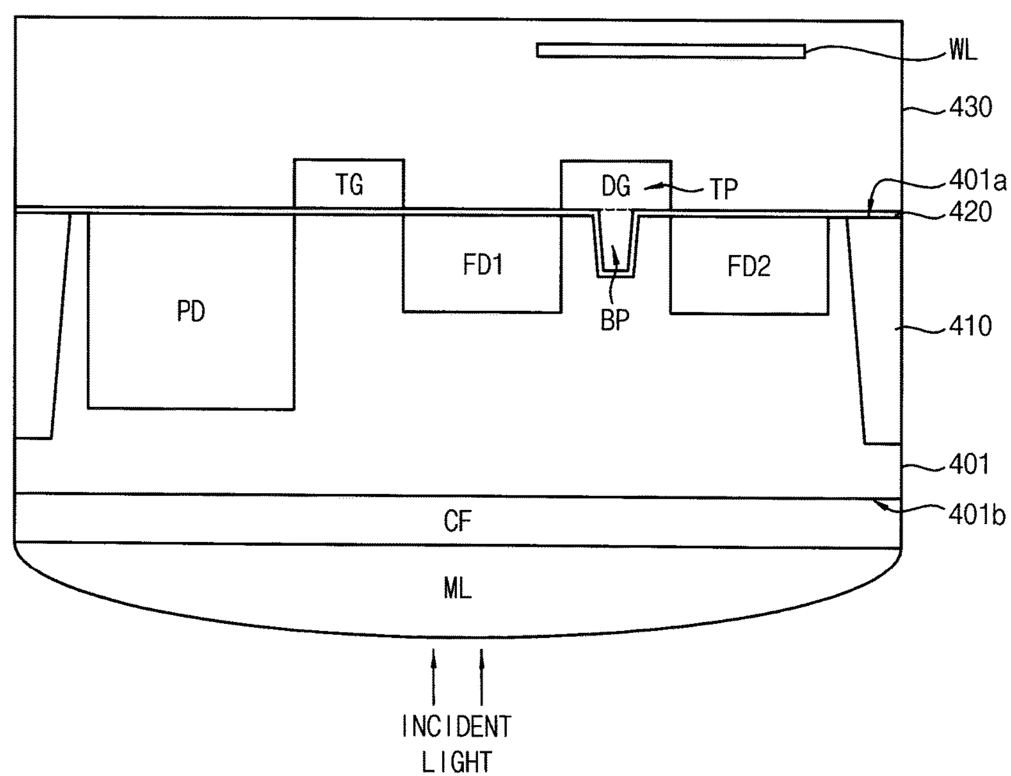
FIG. 11 is a cross-sectional view illustrating a unit pixel of an image sensor according to an exemplary embodiment.

FIG. 11 is a cross-sectional view illustrating a unit pixel of an image sensor according to an exemplary embodiment.

Referring to FIG. 11, a unit pixel 400 of an image sensor includes a photoelectric conversion region PD, a first floating diffusion region FD1, a transfer gate TG, a second floating diffusion region FD2, and a DCG gate DG that are formed in or over a semiconductor substrate 401. The unit pixel 400 of the image sensor may further include an isolation region 410, a first dielectric layer 420, a second dielectric layer 430, a color filter CF, and a micro lens ML. For example, the unit pixel 400 of FIG. 11 may be included in the BIS.

The semiconductor substrate 401 may have a first surface 401*a* and a second surface 401*b* that corresponds to the first surface 401*a*, e.g., on an opposite side of the semiconductor substrate 401. For example, the first surface 401*a* may be a front surface of the semiconductor substrate 401, and the second surface 401*b* may be a back surface of the semiconductor substrate 401.

The photoelectric conversion region PD, the first floating diffusion region FD1, the second floating diffusion region FD2, the transfer gate TG, and the DCG gate DG in FIG. 11 may be the same as, substantially the same as, or similar to the photoelectric conversion region PD, the first floating diffusion region FD1, the second floating diffusion region FD2, the transfer gate TG, and the DCG gate DG in FIG. 1, respectively.

The isolation region 410 may extend vertically (i.e., perpendicularly) or substantially vertically with respect to the first surface 401*a* of the semiconductor substrate 401. As will be described below with reference to FIG. 12A, a unit pixel area may be defined based on the isolation region 410. The photoelectric conversion region PD, the first floating diffusion region FD1, the second floating diffusion region FD2, the transfer gate TG, and the DCG gate DG may be formed within the unit pixel area. The isolation region 410 may include (e.g., be filled with) dielectric material.

According to one or more exemplary embodiments, the unit pixel 400 may further include a polysilicon region that is included in the isolation region 410 and/or may further include a surface doping layer that surrounds or encases the isolation region 410. The polysilicon region may be surrounded by the isolation region 410 and may be formed of polysilicon, metal, and/or metal compound. The surface doping layer may be formed by, for example, implanting impurities (e.g., p-type) into the semiconductor substrate 401 at the radially inner and outer surfaces of the isolation region 410 using an ion implantation process, such as a PLAsma Doping (PLAD). For example, the surface doping layer may contain the same type of impurities as the semiconductor substrate 401 but at a higher density (concentration). Alternatively, the surface doping layer may contain the opposite type of impurities as the photoelectric conversion region PD but at a higher density (concentration).

The first dielectric layer 420 may be formed on the first surface 401*a* of the semiconductor substrate 401. The gate structures TG and DG may be electrically insulated from the semiconductor substrate 401 by the first dielectric layer 420. Thus, the first dielectric layer 420 may be referred to as a gate dielectric layer.

The second dielectric layer 430 may be formed over the first surface 401*a* of the semiconductor substrate 401, for example, on the transfer gate TG and the DCG gate DG. The second dielectric layer 430 may include a plurality of metal lines WL. The plurality of metal lines WL may be electrically connected to the gate structures TG and DG or each other through contacts and/or plugs. For example, the plurality of metal lines WL may be provided by forming a conductive layer of copper, tungsten, titanium, and/or aluminum, and by patterning the conductive layer. Furthermore, it is understood that the second dielectric layer 430 may have a multi-layer structure in which a plurality of dielectric layers are stacked.

According to one or more exemplary embodiments, the second dielectric layer 430 may further include additional gate structures. The signal generating circuit 212 in FIG. 4 or the signal generating circuit 312 in FIG. 7 may be implemented by configurations and connections of the gate structures TG and DG, the additional gate structures, and the plurality of metal lines WL.

The color filter CF may be formed on the second surface 401*b* of the semiconductor substrate 401. The color filter CF may be optically aligned with the photoelectric conversion region PD. The color filter CF may be part of a color filter array of the image sensor, e.g., may be one color filter in a matrix of color filters. For example, the color filter array may include red filters, green filters, and/or blue filters (e.g., a Bayer pattern). In other words, the color filter CF may be one of the red, green, and blue filters of a Bayer filter. Alternatively, the color filter array may include yellow filters, magenta filters, and/or cyan filters. In other words, the color filter CF may be a yellow, magenta, or cyan filter. The color filter array may also include white filters.

The micro lens ML may be formed on the color filter CF. The micro lens ML may be optically aligned with the photoelectric conversion region PD and to the color filter CF, respectively. In other words, the micro lens ML may focus the incident light entering the micro lens ML onto the photoelectric conversion region PD. The micro lens ML may be part of a micro lens array of the image sensor, e.g., may be one micro lens in a matrix of micro lenses.

According to one or more exemplary embodiments, the unit pixel 400 may further include an anti-reflection layer that is interposed between the second surface 401*b* of the semiconductor substrate 401 and the color filter CF. The anti-reflection layer may reduce and/or prevent the incident light from being reflected by the second surface 401*b* of the semiconductor substrate 410. Also, the anti-reflective layer may be a laminate of alternately disposed materials having different refractive indices.

FIGS. 12A, 12B, 12C, 12D, 12E and 12F are cross-sectional views for describing a method of manufacturing the unit pixel 400 of FIG. 11 and a method of manufacturing an image sensor including the unit pixel 400 of FIG. 11.

Figure 12A:
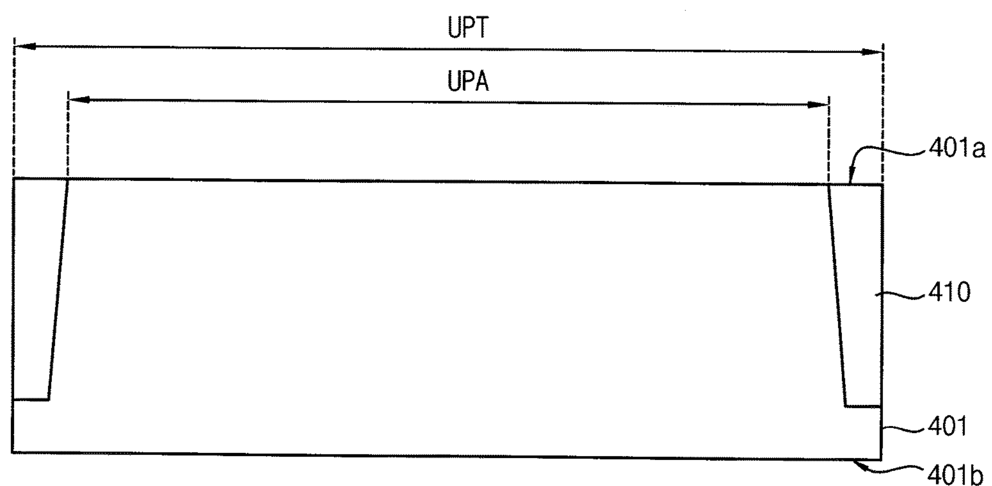
FIGS. 12A, 12B, 12C, 12D, 12E, and 12F are cross-sectional views for describing a method of manufacturing the unit pixel 400 of FIG. 11 and a method of manufacturing an image sensor including the unit pixel of FIG. 11.

Referring to FIG. 12A, the isolation region 410 may be formed to extend vertically (i.e., perpendicularly) or substantially vertically with respect to the first surface 401*a* of the semiconductor substrate 401. Among the whole area UPT of the semiconductor substrate 401, a unit pixel area UPA may be defined based on the isolation region 410. For example, the semiconductor substrate 401 may be a p-type epitaxial layer. The p-type epitaxial layer may be formed on a p-type bulk silicon substrate, the p-type bulk silicon substrate may be grinded using a mechanical process and/or a chemical process, and thus the semiconductor substrate 401 may be provided. In addition, trenches may be formed by etching a portion of the semiconductor substrate 401, the trenches may be filled with dielectric material, and thus the isolation region 410 may be provided.

Furthermore, it is understood that the isolation region 410 may be formed by repeatedly implanting the dielectric material into the semiconductor substrate 401 with different energies. Thus, the isolation region 410 may have an embossed shape as the result of the process of implanting the dielectric material repeatedly but at different energies.

Figure 12B:
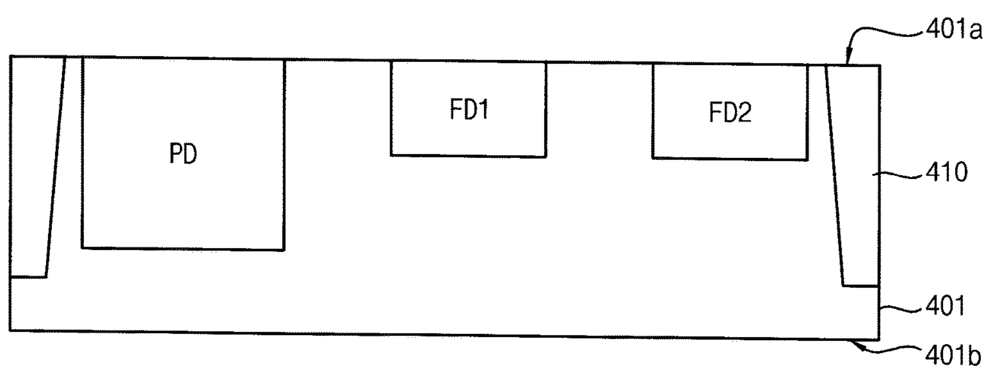

Referring to FIG. 12B, the photoelectric conversion region PD, the first floating diffusion region FD1, and the second floating diffusion region FD2 may be formed in the semiconductor substrate 401. For example, impurities (e.g., n-type) may be implanted into the semiconductor substrate 401 using, e.g., the ion implantation process, and thus the photoelectric conversion region PD, the first floating diffusion region FD1, and the second floating diffusion region FD2 may be provided.

Furthermore, it is understood that the photoelectric conversion region PD may be formed of a plurality of doped regions having different conductivity levels of the same type.

According to one or more exemplary embodiments, the photoelectric conversion region PD, the first floating diffusion region FD1, and the second floating diffusion region FD2 may be sequentially formed, may be simultaneously (e.g., concurrently) formed, may be substantially simultaneously formed. Although FIGS. 12A and 12B illustrate that the photoelectric conversion region PD, the first floating diffusion region FD1, and the second floating diffusion region FD2 are formed after the isolation region 410 is formed, it is understood that the photoelectric conversion region PD, the first floating diffusion region FD1, and the second floating diffusion region FD2 may be formed before the isolation region 410 is formed, may be formed simultaneously with the isolation region 410, or may be formed substantially simultaneously with the isolation region 410.

Figure 12C:
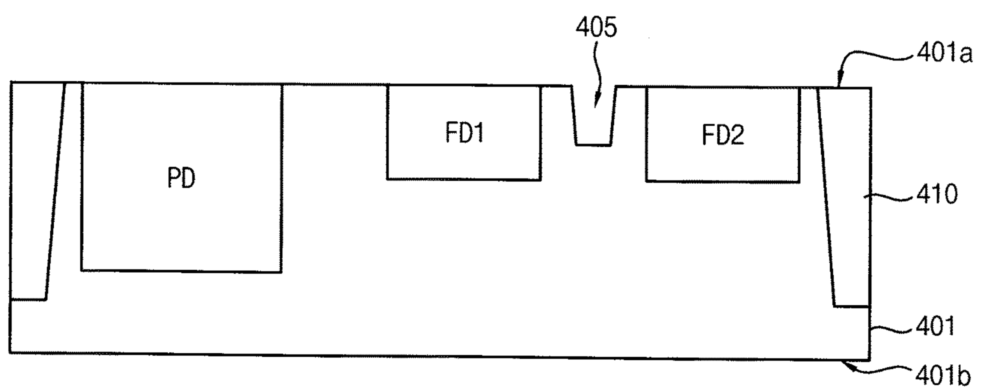

Referring to FIG. 12C, a recess 405 may be formed at the first surface 401*a* of the semiconductor substrate 401 by removing a portion of the semiconductor substrate 401 between the first floating diffusion region FD1 and the second floating diffusion region FD2. For example, an upper portion of the semiconductor substrate 401 may be etched to a predetermined or given depth using a dry etching process and/or a wet etching process, and thus the recess 405 may be provided. The recess 405 may be formed so as to correspond to the DCG gate DG in FIG. 12D and may have various shapes and depths. In this regard, the method of manufacturing may further include determining the depth of the recess 405 according to a desired conversion gain of the unit pixel 400. As set forth above, the conversion gain of the unit pixel 400 may be reduced as the depth of the at least one bottom portion of the DCG gate DG is increased. Thus, and by way of example, the forming the recess 405 may include removing the portion of the substrate 401 to a depth in the substrate 401 that is greater than half of a depth of the first floating diffusion region FD1 and half of a depth of the second floating diffusion region FD2. According to another exemplary embodiment, the forming the recess 405 may include removing the portion of the substrate 401 to a depth in the substrate 401 that is less than half of a depth of the first floating diffusion region FD1 and half of a depth of the second floating diffusion region FD2.

Furthermore, it is understood that a channel impurity region may be formed by implanting impurities (e.g., p-type) into a sidewall and a bottom surface of the recess 405.

Figure 12D:
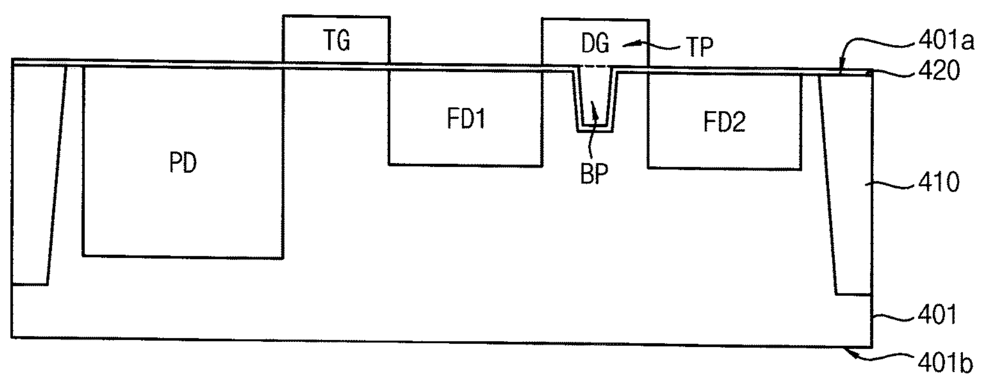

Referring to FIG. 12D, the first dielectric layer 420 may be formed on the first surface 401*a* of the semiconductor substrate 401, and the transfer gate TG and the DCG gate DG may be formed on the first dielectric layer 420. For example, the first dielectric layer 420 may be formed of at least one material selected from the group consisting of silicon oxide (SiOx), silicon oxynitride (SiOxNy), silicon nitride (SiNx), germanium oxynitride (GeOxNy), germanium silicon oxide (GeSixOy), and high-k dielectric materials (e.g., hafnium oxide (HfOx), zirconium oxide (ZrOx), aluminum oxide (AlOx), tantalum oxide (TaOx), hafnium silicate (HfSix), and zirconium silicate (ZrSix)). In addition, a gate conductive layer may be formed on the first surface 401*a* of the semiconductor substrate 401, the gate conductive layer may be patterned, and thus the transfer gate TG structure and the DCG gate DG structure may be provided. The transfer gate TG may be formed over the semiconductor substrate 401 between the photoelectric conversion region PD and the first floating diffusion region FD1. The DCG gate DG may be formed by filling the recess 405 in FIG. 12C and may extend vertically (i.e., perpendicularly) or substantially vertically with respect to the first surface 401*a* of the semiconductor substrate 401 to be adjacent to the first floating diffusion region FD1 and the second floating diffusion region FD2. For example, a conductive layer, which is formed of doped polysilicon, metal, metal nitride, and/or metal silicide, may be formed to fill an inside of the recess 405 in FIG. 12C, and thus the vertical DCG gate DG may be provided.

According to one or more exemplary embodiments, the transfer gate TG and the DCG gate DG may be sequentially formed, may be simultaneously (e.g., concurrently) formed, or may be substantially simultaneously formed.

Furthermore, while the present exemplary embodiment relates to a unit pixel 400 and a method of manufacturing the same in which the unit pixel includes a transfer gate TG formed over the semiconductor substrate 401, it is understood that one or more other exemplary embodiments are not limited thereto. For example, according to another exemplary embodiment, the transfer gate TG may be provided as a vertical transfer gate TG, i.e., similar to the vertical gate structure of the DCG gate DG. In this case, the transfer gate TG may be formed in a similar method as the DCG gate DG as described above. For example, an additional recess may be formed at the first surface 401*a* of the semiconductor substrate 401 by removing a portion of the semiconductor substrate 401 between the photoelectric conversion region PD and the first floating diffusion region FD1, and subsequently filled.

Moreover, it is understood that in one or more other exemplary embodiments, the DCG gate DG (and the transfer gate TG) may be formed with plural bottom portions BP. That is, a recess 405 may be formed at the first surface 401*a* of the semiconductor substrate 401 by removing plural portions of the semiconductor substrate 401 between the first floating diffusion region FD1 and the second floating diffusion region FD2, and the plurality of recesses 405 may be filled as described above to form the vertical gate structure of the DCG gate DG. In this case, the method of manufacturing may further include determining a number of bottom portions BP for the DCG gate DG based on a desired conversion gain of the unit pixel 400. In this regard, as described above, the conversion gain of the unit pixel 400 may be reduced as the number of the bottom portions BP is increased.

Figure 12E:
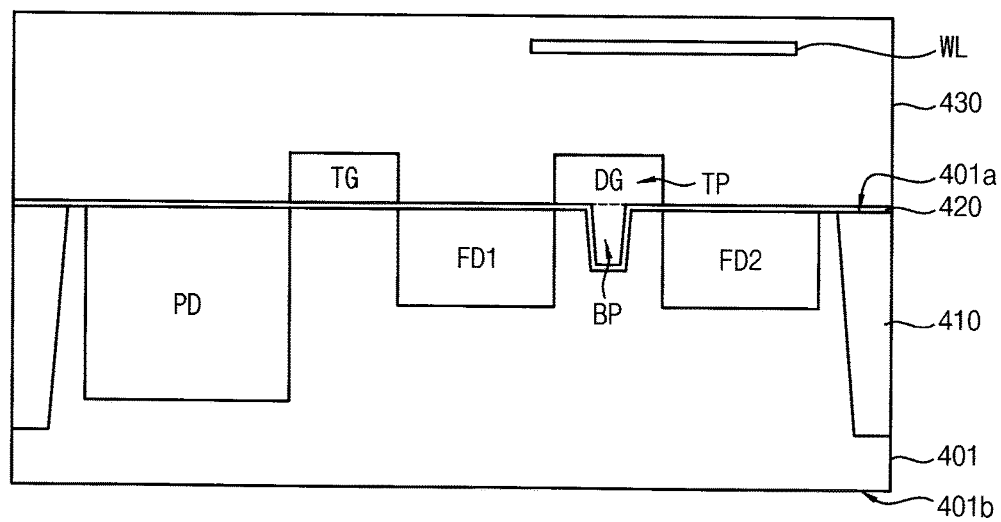
Figure 12F:
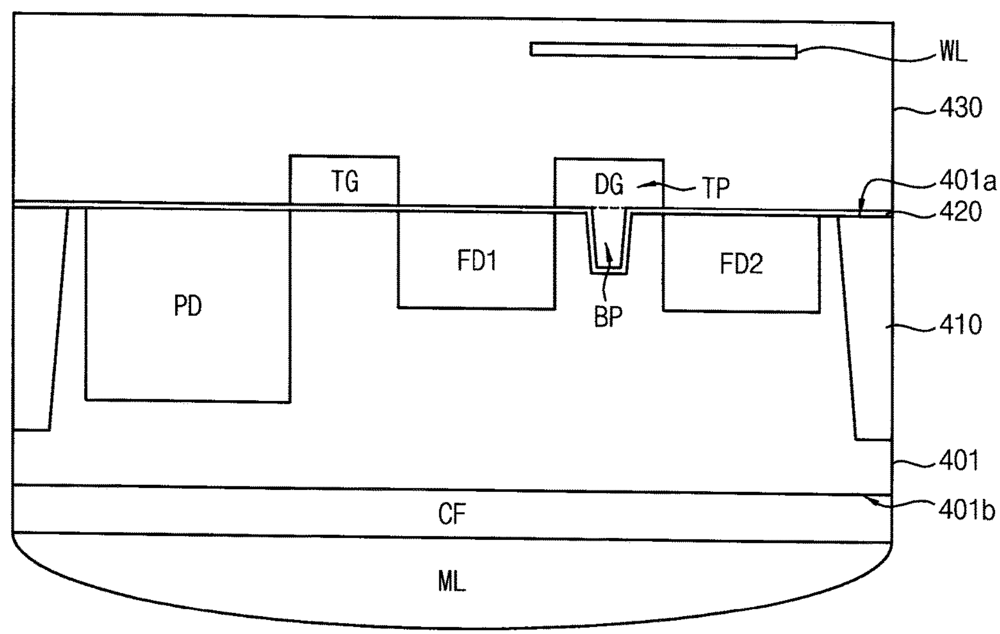

Referring to FIG. 12E, the second dielectric layer 430 that includes the plurality of metal lines WL may be formed on the transfer gate TG and the DCG gate DG. Referring to FIG. 12F, the color filter CF may be formed on the second surface 401*b* of the semiconductor substrate 401, and the micro lens ML may be formed on the color filter CF.

For example, the color filter CF may be provided by coating the second surface 401*b* of the semiconductor substrate 401 with photosensitive material, e.g., a photo-resist, and by patterning the photosensitive material, e.g., by exposing and developing the photosensitive material using a mask. The patterned photosensitive material may be dyed, or a pigment may be dispersed in the photosensitive material to provide the color of the color filter. Alternatively, the color filter CF may be formed by a color printing process. In addition, the micro lens ML may be provided by forming a layer of transparent photoresist on the color filter CF and by reflowing the layer so as to be convex. Then, the photoresist may be baked to fix the convex shape.

According to one or more exemplary embodiments, a planarization layer, e.g., an over-coating layer (OCL), may be formed between the color filter CF and the micro lens ML.

Figure 13:
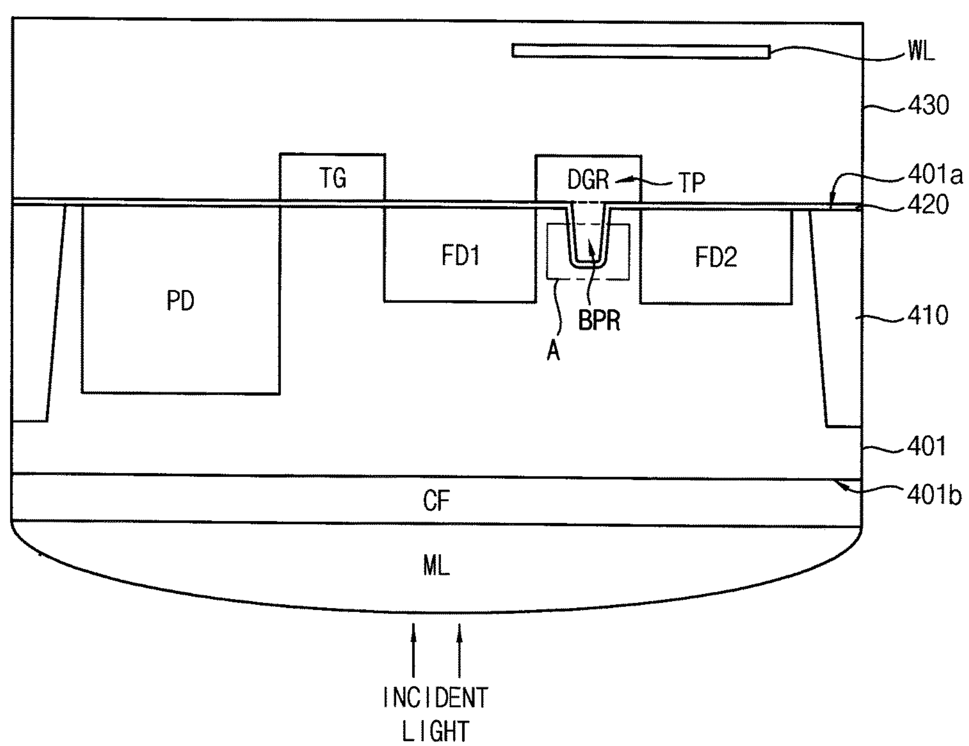
FIG. 13 is a cross-sectional view illustrating a unit pixel of an image sensor according to an exemplary embodiment.
Figure 14:
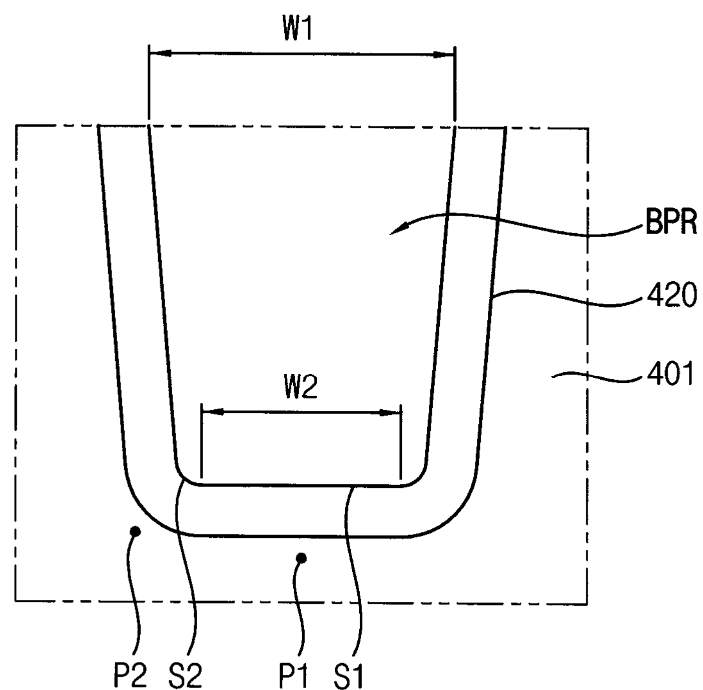
FIG. 14 is an enlarged view of a portion “A” in FIG. 13.

FIG. 13 is a cross-sectional view illustrating a unit pixel 400*a* of an image sensor according to an exemplary embodiment. FIG. 14 is an enlarged view of a portion "A" in FIG. 13.

Referring to FIGS. 13 and 14, a unit pixel 400*a* of an image sensor includes a photoelectric conversion region PD, a first floating diffusion region FD1, a transfer gate TG, a second floating diffusion region FD2, and a DCG gate DGR that are formed in or over a semiconductor substrate 401. The unit pixel 400*a* of the image sensor may further include an isolation region 410, a first dielectric layer 420, a second dielectric layer 430, a color filter CF and a micro lens ML.

The photoelectric conversion region PD, the first floating diffusion region FD1, the second floating diffusion region FD2, the transfer gate TG, the isolation region 410, the first dielectric layer 420, the second dielectric layer 430, the color filter CF, and the micro lens ML in FIG. 13 may be the same as, substantially the same as, or similar to the photoelectric conversion region PD, the first floating diffusion region FD1, the second floating diffusion region FD2, the transfer gate TG, the isolation region 410, the first dielectric layer 420, the second dielectric layer 430, the color filter CF, and the micro lens ML in FIG. 11, respectively.

The DCG gate DGR extends vertically (i.e., perpendicularly) or substantially vertically with respect to the first surface 401*a* of the semiconductor substrate 401 to be adjacent to the first floating diffusion region FD1 and the second floating diffusion region FD2. The DCG gate DGR may be divided into at least one bottom portion BPR and a top portion TP.

In one or more exemplary embodiments, as illustrated in FIG. 14, the at least one bottom portion BPR of the DCG gate DGR may include a flat bottom surface S1 and a rounded lower corner S2. In other words, the bottom surface S1 of the at least one bottom portion BPR may be flat, and the lower corner S2 of the at least one bottom portion BPR may be formed to have a rounded profile. In this case, an electric field may have a uniform distribution around the at least one bottom portion BPR of the DCG gate DGR. For example, when the DCG control signal (e.g., DX in FIG. 1) applied to the DCG gate DGR is activated, there is substantially no difference in electric field between a point P1, which is in the semiconductor substrate 401 and adjacent to the flat bottom surface S1, and a point P2, which is in the semiconductor substrate 401 and adjacent to the rounded lower corner S2. Thus, a channel may be properly formed between the first floating diffusion region FD1 and the second floating diffusion region FD2, and photo-charges may be easily transferred from the first floating diffusion region FD1 to the second floating diffusion region FD2. By way of example, the rounded corner may form an arc having a radius of about 10 nm to about 100 nm. According to another example, the rounded corner may form an arc having a radius of about 60 nm to about 100 nm.

In one or more exemplary embodiments, a first width W1, which represents a top width of the at least one bottom portion BPR, may be greater than a second width W2, which represents a width of the flat bottom surface S1. For example, the second width W2 may be about half of the first width W1.

FIGS. 15A, 15B, 15C and 15D are cross-sectional views for describing a method of manufacturing the unit pixel of FIG. 13 400*a* and a method of manufacturing an image sensor including the unit pixel 400*a* of FIG. 13.

In the present exemplary embodiment, the operations for forming the isolation region 410, the photoelectric conversion region PD, the first floating diffusion region FD1, and the second floating diffusion region FD2 may be the same as, substantially the same as, or similar to those illustrated in and described with reference to FIGS. 12A and 12B, respectively. In addition, the processes shown in FIGS. 15A through 15D may be similar to those shown in and described with reference to FIGS. 12C through 12F, respectively, except for the at least one bottom portion BPR including the flat bottom surface and the rounded lower corner, and therefore these same or similar processes will not be described again.

Figure 15A:
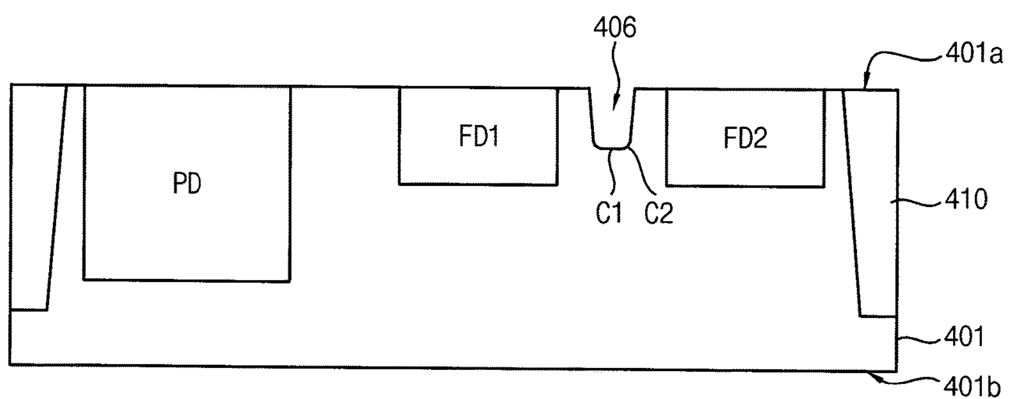
FIGS. 15A, 15B, 15C, and 15D are cross-sectional views for describing a method of manufacturing the unit pixel of FIG. 13 and a method of manufacturing an image sensor including the unit pixel of FIG. 13.

Referring to FIG. 15A, a recess 406 may be formed by removing a portion of the semiconductor substrate 401 between the first floating diffusion region FD1 and the second floating diffusion region FD2. For example, an upper portion of the semiconductor substrate 401 may be etched to a predetermined or given depth, and thus the recess 406 may be provided. The recess 406 may be formed so as to correspond to the DCG gate DGR in FIG. 15B. The recess 406 may include a flat bottom surface C1 and a rounded lower corner C2.

In one or more exemplary embodiments, an anisotropic etching process may be performed to form a sharp corner of the recess, an isotropic etching process may be performed to round the sharp corner of the recess, and thus the recess 406 including the flat bottom surface C1 and the rounded lower corner C2 may be provided. In one or more other exemplary embodiments, the anisotropic etching process may be performed to form a sharp corner of the recess, a thermal oxidation process may be performed to form a thermal oxide layer, the thermal oxide layer may be removed, and thus the recess 406 including the flat bottom surface C1 and the rounded lower corner C2 may be provided.

Figure 15B:
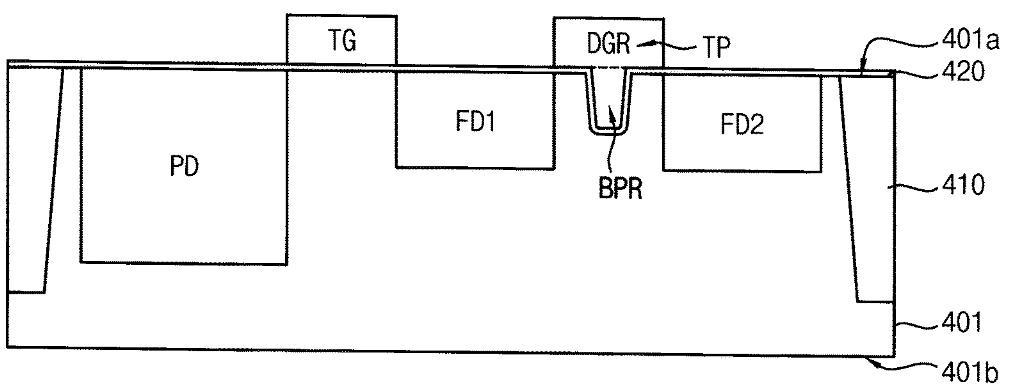
Figure 15C:
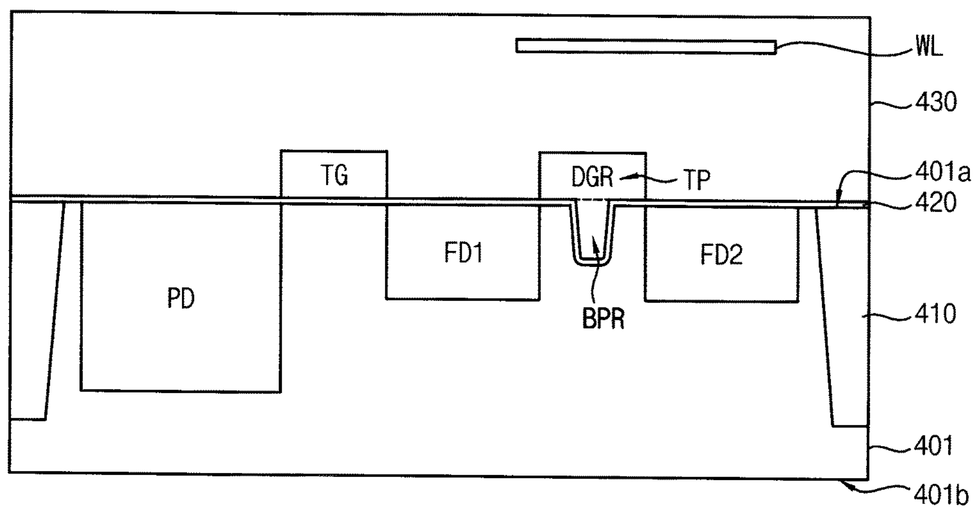
Figure 15D:
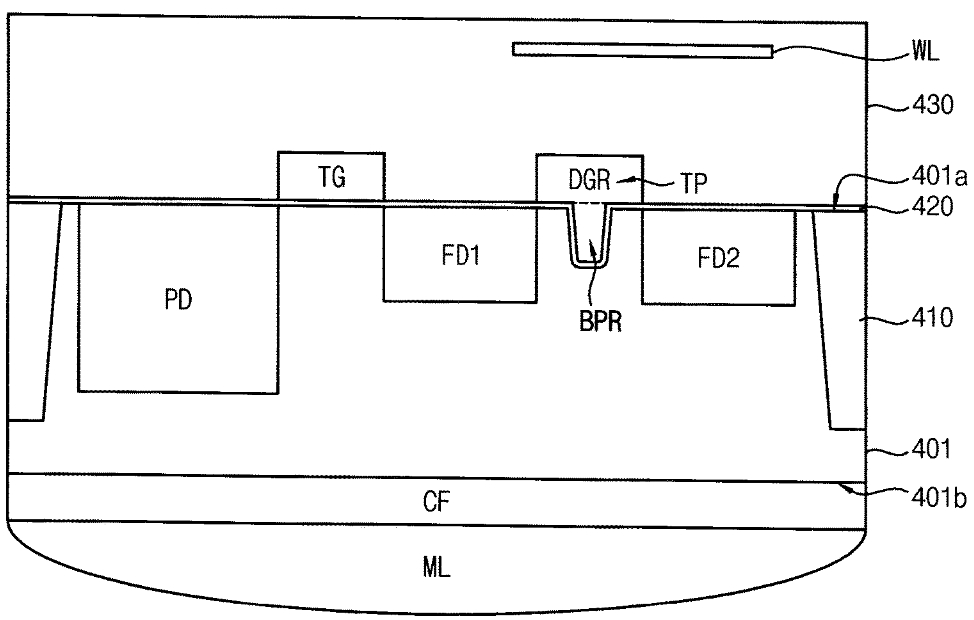

Referring to FIG. 15B, the first dielectric layer 420 may be formed on the first surface 401*a* of the semiconductor substrate 401, and the transfer gate TG and the DCG gate DGR may be formed on the first dielectric layer 420. Referring to FIG. 15C, the second dielectric layer 430 that includes the plurality of metal lines WL may be formed on the transfer gate TG and the DCG gate DGR. Referring to FIG. 15D, the color filter CF may be formed on the second surface 401*b* of the semiconductor substrate 401, and the micro lens ML may be formed on the color filter CF.

FIGS. 16 through 21 are cross-sectional views illustrating a unit pixel 400*b*, 400*c*, 400*d*, 400*e*, 400*f*, 400*g* of an image sensor according to exemplary embodiments.

Figure 16:
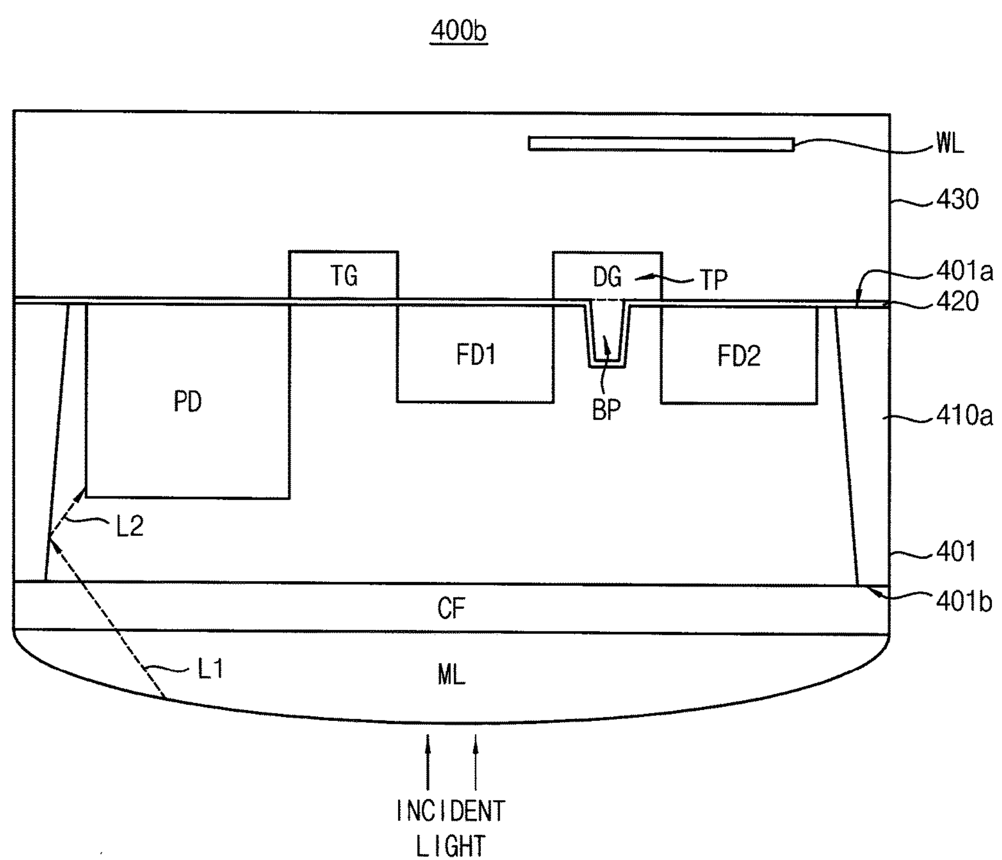
FIGS. 16 through 21 are cross-sectional views illustrating a unit pixel of an image sensor according to exemplary embodiments.

Referring to FIG. 16, a unit pixel 400*b* of an image sensor includes a photoelectric conversion region PD, a first floating diffusion region FD1, a transfer gate TG, a second floating diffusion region FD2, and a DCG gate DG that are formed in or over a semiconductor substrate 401. The unit pixel 400*b* of the image sensor may further include an isolation region 410*a*, a first dielectric layer 420, a second dielectric layer 430, a color filter CF, and a micro lens ML.

The photoelectric conversion region PD, the first floating diffusion region FD1, the second floating diffusion region FD2, the transfer gate TG, the DCG gate DG, the first dielectric layer 420, the second dielectric layer 430, the color filter CF, and the micro lens ML in FIG. 16 may be the same as, substantially the same as, or similar to the photoelectric conversion region PD, the first floating diffusion region FD1, the second floating diffusion region FD2, the transfer gate TG, the DCG gate DG, the first dielectric layer 420, the second dielectric layer 430, the color filter CF, and the micro lens ML in FIG. 11, respectively.

The isolation region 410*a* in FIG. 16 may be formed vertically (i.e., perpendicularly) or substantially vertically with respect to the first surface 401*a* of the semiconductor substrate 401 and may extend to a depth greater than that to which the photoelectric conversion region PD extends, relative to the first surface 401*a* of the semiconductor substrate 401. For example, the isolation region 410*a* may be the DTI region and may extend from the first surface 401*a* of the semiconductor substrate 401 to the second surface 401*b* of the semiconductor substrate 401. In other words, an end surface of the isolation region 410*a* may coincide with the second surface 401*b* of the semiconductor substrate 401.

In one or more exemplary embodiments, the isolation region 410*a* may be filled with dielectric material whose refractive index is lower than the refractive index of the semiconductor substrate 401. Although some of the incident light is refracted by the micro lens ML, a leakage component L1 of the incident light may be reflected totally internally at the sidewall surface of the isolation region 410*a*. A reflection component L2 may reach the photoelectric conversion region PD, and thus neighboring unit pixels of the image sensor are shielded from the leakage component L1. In addition, since the isolation region 410*a* is of the dielectric material, the diffusion carriers generated by the incident light may be sufficiently prevented from being transferred to the neighboring unit pixels from the photoelectric conversion region PD. Thus, undesirable optical and/or electrical crosstalk may be efficiently prevented, and an image sensor including the unit pixel 400*b* may possess an improved signal-to-noise ratio (SNR).

Figure 17:
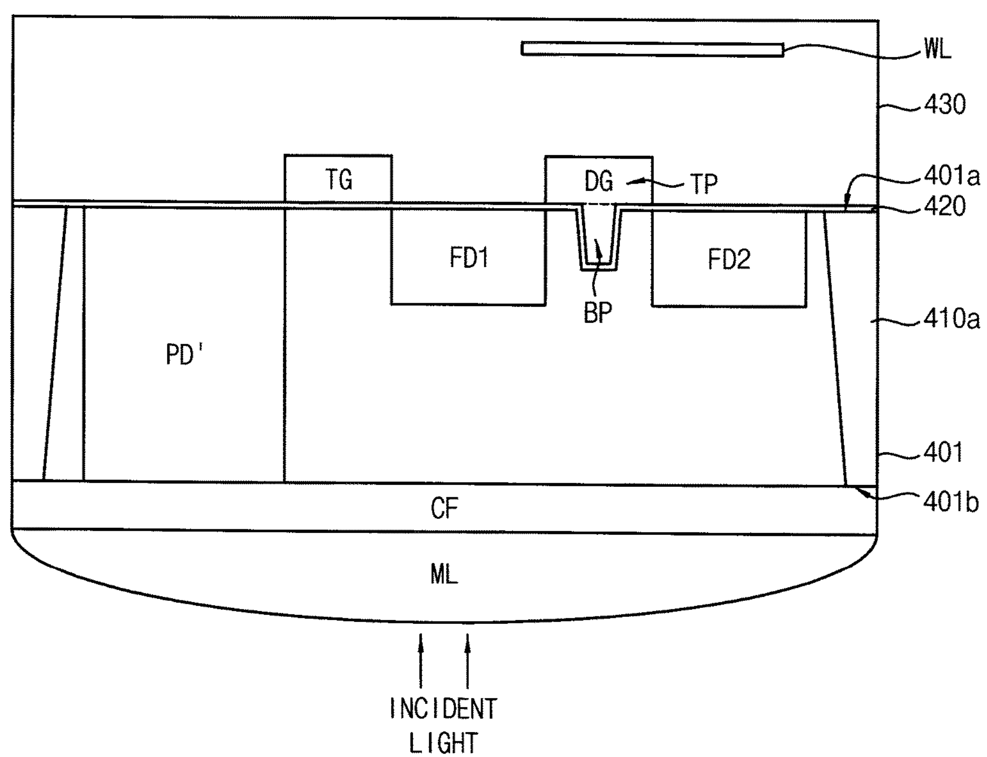

Referring to FIG. 17, a unit pixel 400*c* of an image sensor includes a photoelectric conversion region PD', a first floating diffusion region FD1, a transfer gate TG, a second floating diffusion region FD2, and a DCG gate DG that are formed in or over a semiconductor substrate 401. The unit pixel 400*c* of the image sensor may further include an isolation region 410*a*, a first dielectric layer 420, a second dielectric layer 430, a color filter CF, and a micro lens ML.

The first floating diffusion region FD, the second floating diffusion region FD2, the transfer gate TG, the DCG gate DG, the first dielectric layer 420, the second dielectric layer 430, the color filter CF, and the micro lens ML in FIG. 17 may be the same as, substantially the same as, or similar to the first floating diffusion region FD1, the second floating diffusion region FD2, the transfer gate TG, the DCG gate DG, the first dielectric layer 420, the second dielectric layer 430, the color filter CF, and the micro lens ML in FIG. 11, respectively. The isolation region 410*a* in FIG. 17 may be the same as, substantially the same as, or similar to the isolation region 410*a* in FIG. 16.

The photoelectric conversion region PD' in FIG. 17 is formed in the semiconductor substrate 401 and may extend to the second surface 401*b* of the semiconductor substrate 401. That is, while the photoelectric conversion region PD in FIG. 16 may only extend from the first surface 401*a* of the semiconductor substrate 401, the photoelectric conversion region PD' in FIG. 17 extends from the first 401*a* and extends to the second surface 401*b* of the semiconductor substrate 401. Furthermore, it is understood that, in one or more other exemplary embodiments, the photoelectric conversion region may extend to the second surface 401*b* of the semiconductor substrate 401 without extending from the first surface 401*a*.

According to one or more exemplary embodiments, as illustrated above with reference to FIGS. 13 and 14, the DCG gate DG in FIGS. 16 and 17 may include the flat bottom surface and the rounded lower corner.

Figure 18:
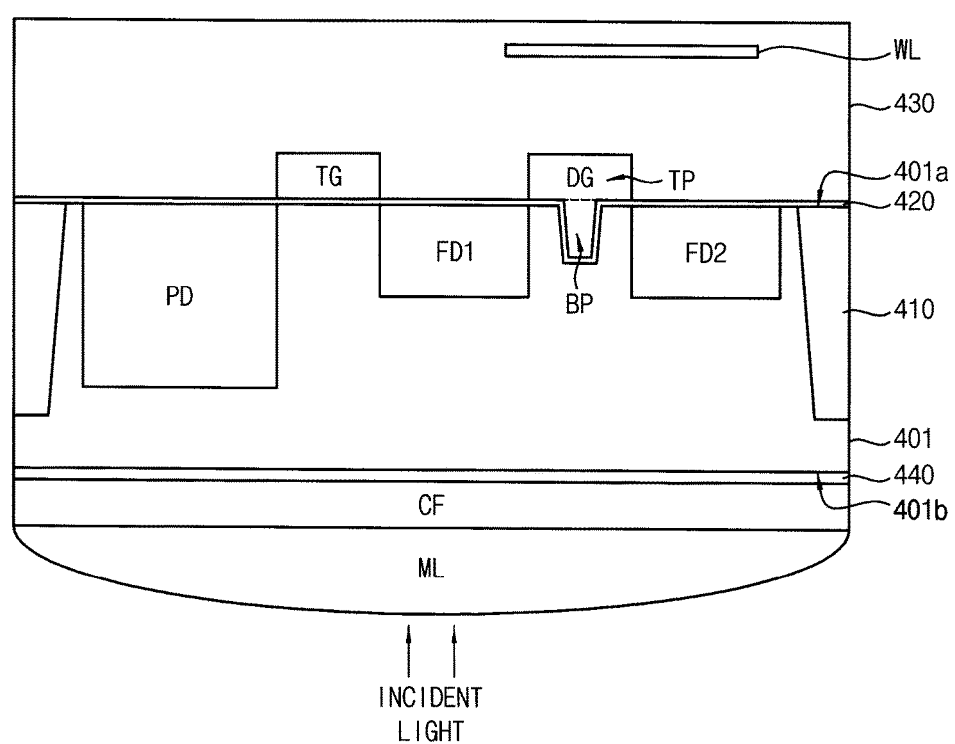

Referring to FIG. 18, a unit pixel 400*d* of an image sensor includes a photoelectric conversion region PD, a first floating diffusion region FD1, a transfer gate TG, a second floating diffusion region FD2, and a DCG gate DG that are formed in or over a semiconductor substrate 401. The unit pixel 400*d* of the image sensor may further include an isolation region 410, a first dielectric layer 420, a second dielectric layer 430, a third dielectric layer 440, a color filter CF, and a micro lens ML.

The photoelectric conversion region PD, the first floating diffusion region FD1, the second floating diffusion region FD2, the transfer gate TG, the DCG gate DG, the isolation region 410, the first dielectric layer 420, the second dielectric layer 430, the color filter CF, and the micro lens ML in FIG. 18 may be the same as, substantially the same as, or similar to the photoelectric conversion region PD, the first floating diffusion region FD1, the second floating diffusion region FD2, the transfer gate TG, the DCG gate DG, the isolation region 410, the first dielectric layer 420, the second dielectric layer 430, the color filter CF, and the micro lens ML in FIG. 11, respectively.

The third dielectric layer 440 in FIG. 18 may be interposed between the second surface 401*b* of the semiconductor substrate 401 and the color filter CF. By way of example, the third dielectric layer 440 may contain negative fixed charges. For example, the third dielectric layer 440 may be formed of at least one metal oxide selected from the group consisting of oxides of zirconium (Zr), aluminum (Al), tantalum (Ta), titanium (Ti), and Yttrium (Y) and lanthanoids. In addition, the third dielectric layer 440 may have at least one crystallized region.

In the BIS, noise may occur due to surface defects created by, for example, a manufacturing process in a region adjacent to the back surface 401*b* of the semiconductor substrate 401. If the third dielectric layer 440 includes the negative fixed charges, the holes may be accumulated in the region adjacent to the back surface 401*b* of the semiconductor substrate 401. Electric charges generated by the surface defects without any incident light may be coupled with the holes accumulated in the region adjacent to the back surface 401*b* of the semiconductor substrate 401. Thus, dark currents of the image sensor including the unit pixel 400*d* may be reduced, and light guiding efficiency and light sensitivity may be improved in the image sensor.

In one or more exemplary embodiments, the third dielectric layer 440 may include an optical shielding layer for preventing and/or reducing incident light from entering an optical black area.

According to one or more exemplary embodiments, as illustrated above with reference to FIGS. 13 and 14, the DCG gate DG in FIG. 18 may include the flat bottom surface and the rounded lower corner. Furthermore, according to one or more exemplary embodiments, as illustrated above with reference to FIG. 16, the isolation region 410 in FIG. 18 may extend from the first surface 401*a* of the semiconductor substrate 401 towards the second surface 401*b* of the semiconductor substrate 401. Also, according to one or more exemplary embodiments, as illustrated above with reference to FIG. 17, the photoelectric conversion region PD in FIG. 18 may extend to the second surface 401*b* of the semiconductor substrate 401.

Figure 19:
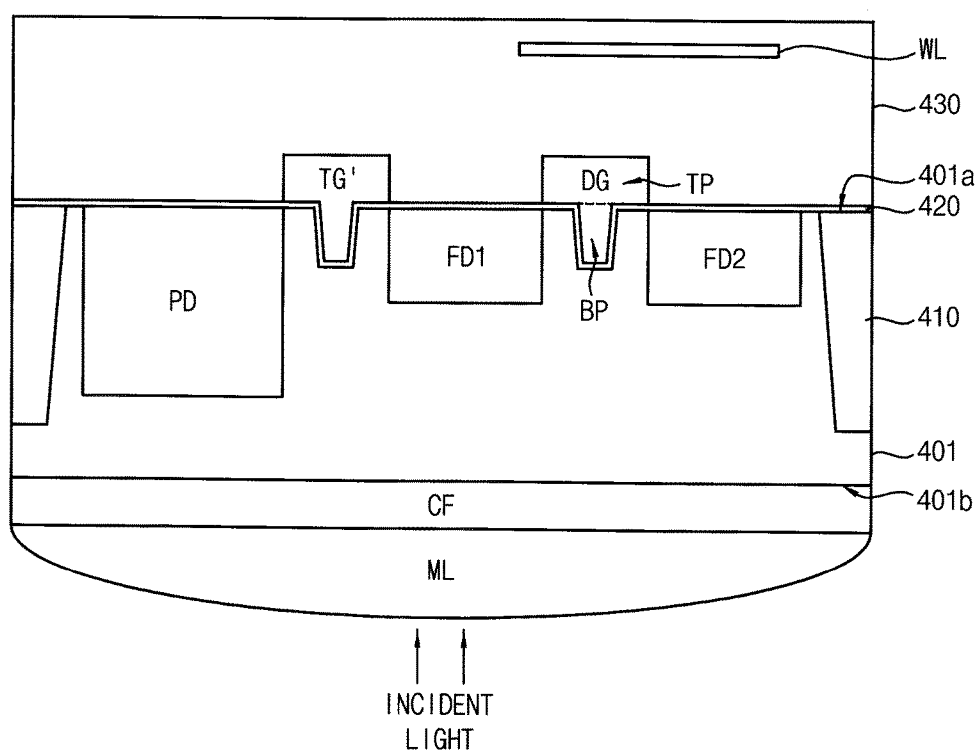

Referring to FIG. 19, a unit pixel 400*e* of an image sensor includes a photoelectric conversion region PD, a first floating diffusion region FD1, a transfer gate TG', a second floating diffusion region FD2, and a DCG gate DG that are formed in or over a semiconductor substrate 401. The unit pixel 400*e* of the image sensor may further include an isolation region 410, a first dielectric layer 420, a second dielectric layer 430, a color filter CF, and a micro lens ML.

The photoelectric conversion region PD, the first floating diffusion region FD1, the second floating diffusion region FD2, the DCG gate DG, the isolation region 410, the first dielectric layer 420, the second dielectric layer 430, the color filter CF, and the micro lens ML in FIG. 19 may be the same as, substantially the same as, or similar to the photoelectric conversion region PD, the first floating diffusion region FD1, the second floating diffusion region FD2, the DCG gate DG, the isolation region 410, the first dielectric layer 420, the second dielectric layer 430, the color filter CF, and the micro lens ML in FIG. 11, respectively.

The transfer gate TG' in FIG. 19 may extend vertically (i.e., perpendicularly) or substantially vertically with respect to the first surface 401*a* of the semiconductor substrate 401 to be adjacent to the photoelectric conversion region PD and the first floating diffusion region FD1. In other words, both the transfer gate TG' and the DCG gate DG may have the vertical gate structure. For example, the transfer gate TG' may be divided into a bottom portion that is formed in the semiconductor substrate 401 and surrounded by the semiconductor substrate 401 and a top portion that is formed over the first surface 401*a* of the semiconductor substrate 401 and connected to the bottom portion.

According to one or more exemplary embodiments, as illustrated above with reference to FIGS. 13 and 14, the DCG gate DG and/or the transfer gate TG' in FIG. 19 may include the flat bottom surface and the rounded lower corner. Furthermore, according to one or more exemplary embodiments, as illustrated above with reference to FIG. 16, the isolation region 410 in FIG. 19 may extend from the first surface 401*a* of the semiconductor substrate 401 towards the second surface 401*b* of the semiconductor substrate 401. Also, according to one or more exemplary embodiments, as illustrated above with reference to FIG. 17, the photoelectric conversion region PD in FIG. 19 may extend to the second surface 401*b* of the semiconductor substrate 401. Moreover, according to one or more exemplary embodiments, as illustrated above with reference to FIG. 18, the unit pixel 400*e* of FIG. 19 may further include the third dielectric layer 440.

Figure 20:
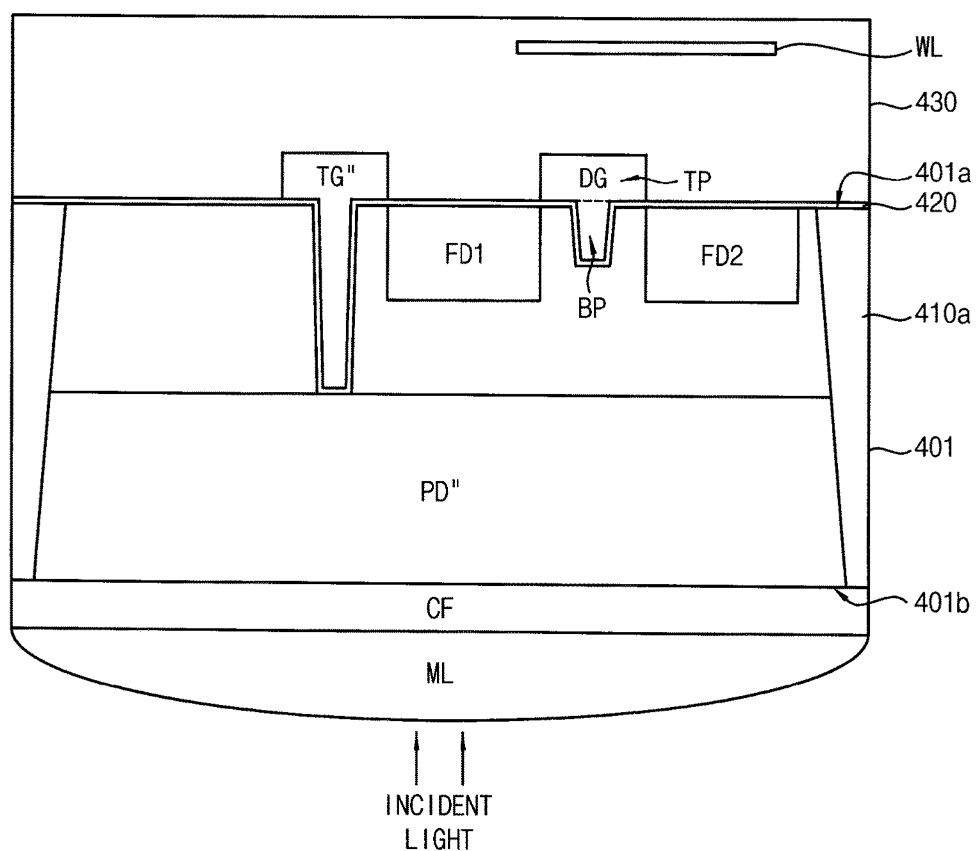

Referring to FIG. 20, a unit pixel 400*f* of an image sensor includes a photoelectric conversion region PD", a first floating diffusion region FD1, a transfer gate TG", a second floating diffusion region FD2, and a DCG gate DG that are formed in or over a semiconductor substrate 401. The unit pixel 400*f* of the image sensor may further include an isolation region 410*a*, a first dielectric layer 420, a second dielectric layer 430, a color filter CF, and a micro lens ML.

The first floating diffusion region FD1, the second floating diffusion region FD2, the DCG gate DG, the first dielectric layer 420, the second dielectric layer 430, the color filter CF, and the micro lens ML in FIG. 20 may be the same as, substantially the same as, or similar to the first floating diffusion region FD1, the second floating diffusion region FD2, the DCG gate DG, the first dielectric layer 420, the second dielectric layer 430, the color filter CF, and the micro lens ML in FIG. 11, respectively. The isolation region 410*a* in FIG. 20 may be the same as, substantially the same as, or similar to the isolation region 410*a* in FIG. 16.

In comparison with the photoelectric conversion region PD in FIG. 11, the photoelectric conversion region PD" in FIG. 20 may be formed relatively deeply with respect to the first surface 401*a* of the semiconductor substrate 401, and may have a relatively large footprint in the semiconductor substrate 401. In other words, the photoelectric conversion region PD" may be spaced a predetermined distance from the first surface 401*a*, and may present a relatively large area (e.g., an entirety or majority of a widthwise dimension) in the unit pixel area (e.g., UPA in FIG. 12A) that receives the incident light. Similar to the transfer gate TG' in FIG. 19, the transfer gate TG" in FIG. 20 may extend vertically (i.e., perpendicularly) or substantially vertically with respect to the first surface 401*a* of the semiconductor substrate 401 to be adjacent to the photoelectric conversion region PD and the first floating diffusion region FD1. Although FIG. 20 illustrates that a portion of the first dielectric layer 420 under the transfer gate TG" extends to the photoelectric conversion region PD", the portion of the first dielectric layer 420 under the transfer gate TG" may be spaced apart from the photoelectric conversion region PD".

According to one or more exemplary embodiments, as illustrated above with reference to FIGS. 13 and 14, the DCG gate DG and/or the transfer gate TG" in FIG. 20 may include the flat bottom surface and the rounded lower corner. Furthermore, according to one or more exemplary embodiments, as illustrated above with reference to FIG. 18, the unit pixel 400*f* of FIG. 20 may further include the third dielectric layer 440.

Figure 21:
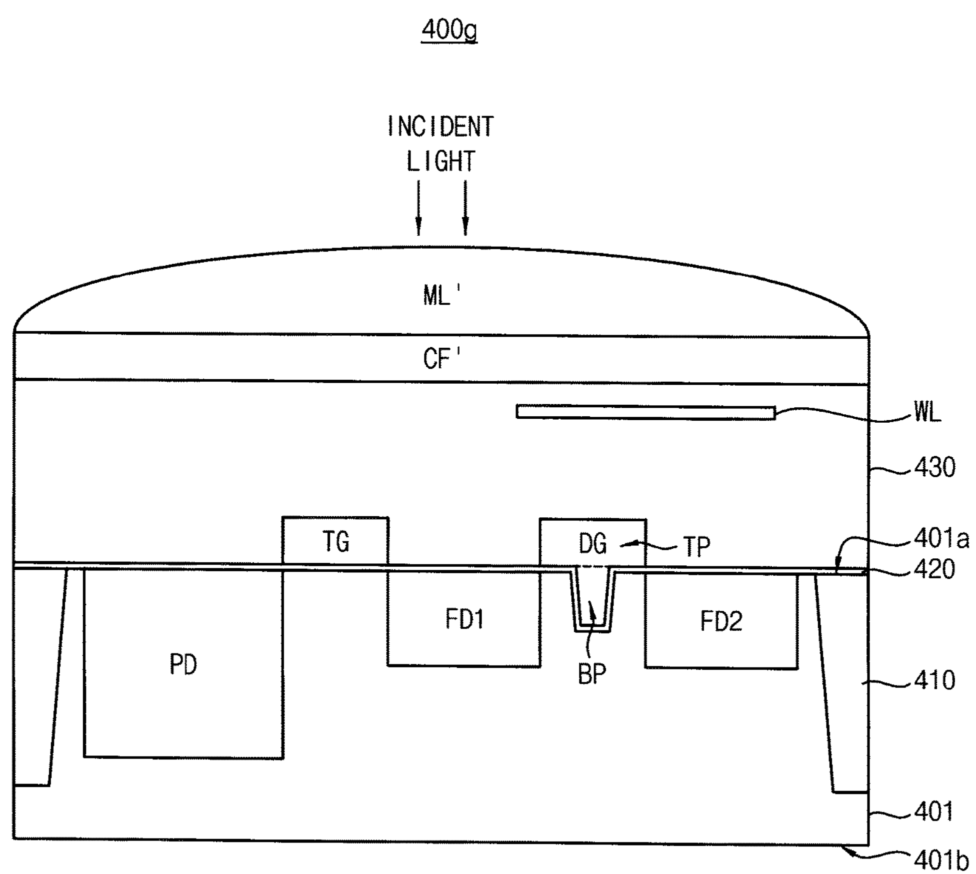

Referring to FIG. 21, a unit pixel 400*g* of an image sensor includes a photoelectric conversion region PD, a first floating diffusion region FD1, a transfer gate TG, a second floating diffusion region FD2, and a DCG gate DG that are formed in or over a semiconductor substrate 401. The unit pixel 400*g* of the image sensor may further include an isolation region 410, a first dielectric layer 420, a second dielectric layer 430, a color filter CF', and a micro lens ML'. For example, the unit pixel 400*g* of FIG. 21 may be included in the FIS.

The photoelectric conversion region PD, the first floating diffusion region FD1, the second floating diffusion region FD2, the transfer gate TG, the DCG gate DG, the isolation region 410, the first dielectric layer 420, and the second dielectric layer 430 in FIG. 21 may be the same as, substantially the same as, or similar to the photoelectric conversion region PD, the first floating diffusion region FD1, the second floating diffusion region FD2, the transfer gate TG, the DCG gate DG, the isolation region 410, the first dielectric layer 420, and the second dielectric layer 430 in FIG. 11, respectively.

The color filter CF' in FIG. 21 may be formed on the first surface 401*a* of the semiconductor substrate 401. For example, the color filter CF' may be formed on the transfer gate TG and the DCG gate DG, or may be formed on the second dielectric layer 430. The micro lens ML' may be formed on the color filter CF'.

According to one or more exemplary embodiments, as illustrated above with reference to FIGS. 13 and 14, the DCG gate DG in FIG. 21 may include the flat bottom surface and the rounded lower corner. Furthermore, according to one or more exemplary embodiments, as illustrated above with reference to FIG. 16, the isolation region 410 in FIG. 21 may extend from the first surface 401*a* of the semiconductor substrate 401 towards the second surface 401*b* of the semiconductor substrate 401. Also, according to one or more exemplary embodiments, as illustrated above with reference to FIG. 17, the photoelectric conversion region PD in FIG. 21 may extend to the second surface 401*b* of the semiconductor substrate 401. Moreover, according to one or more exemplary embodiments, as illustrated above with reference to FIGS. 19 and 20, the transfer gate TG in FIG. 21 may have the vertical gate structure. Further, according to one or more exemplary embodiments, as illustrated above with reference to FIG. 18, the unit pixel 400*g* of FIG. 21 may further include the third dielectric layer 440.

Figure 22:
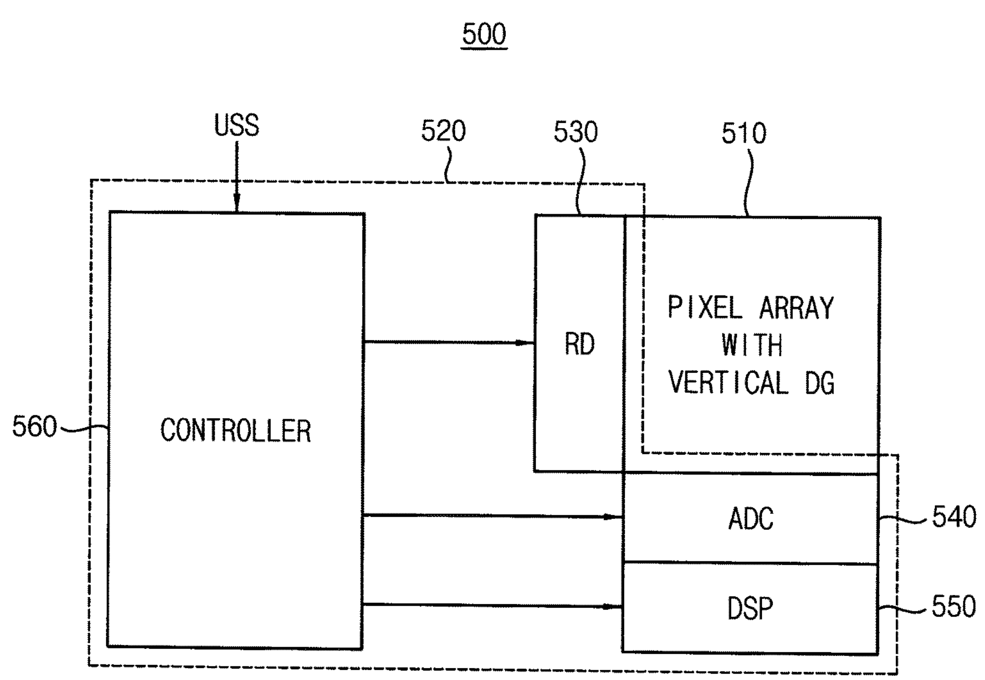
FIG. 22 is a block diagram illustrating an image sensor according to an exemplary embodiment.

FIG. 22 is a block diagram illustrating an image sensor 500 according to an exemplary embodiment.

Referring to FIG. 22, an image sensor 500 includes a pixel array 510 and a signal processor 520.

The pixel array 510 generates a plurality of pixel signals (e.g., analog pixel signals) based on incident light. The pixel array 510 includes a plurality of unit pixels that are arranged in a matrix of a plurality of rows and a plurality of columns. Each unit pixel may be the unit pixel 100 of FIG. 1 and may be implemented with examples described above with reference to FIGS. 2 through 5, 7 through 9, 11, 13, and 16 through 21. In other words, each unit pixel may include the DCG gate having the vertical gate structure such that a surface area of the DCG gate contacting with the semiconductor substrate is increased. As the DCG control signal applied to the DCG gate is selectively activated, a conversion gain of each unit pixel and a conversion gain of the image sensor 500 may be effectively adjusted without a decrease in a fill factor.

The signal processor 520 generates image data (e.g., effective digital image data) based on the plurality of pixel signals. The signal processor 520 may include a row driver 530, an analog-to-digital converter (ADC) 540, a digital signal processor (DSP) 550, and a controller 560.

The row driver 530 may be connected with each row of the pixel array 510. The row driver 530 may generate driving signals to drive each row. For example, the row driver 530 may drive the plurality of unit pixels included in the pixel array 510 row by row.

The ADC 540 may be connected to each column of the pixel array 510. The ADC 540 may convert analog signals (e.g., the pixel signals) output from the pixel array 510 into digital signals (e.g., the image data). In one or more exemplary embodiments, the ADC 540 may perform a column analog-to-digital conversion that converts the analog signals in parallel (e.g., simultaneously or concurrently) using a plurality of analog-to-digital converters respectively coupled to the plurality of columns. In one or more other exemplary embodiments, the ADC 540 may perform a single analog-to-digital conversion that sequentially converts the analog signals using a single analog-to-digital converter.

According to example embodiments, the ADC unit 540 may further include a correlated double sampler (CDS) for extracting an effective signal component. In one or more exemplary embodiments, the CDS may perform an analog double sampling that extracts the effective signal component based on a difference between an analog reset signal including a reset component and an analog data signal including a signal component. In one or more other exemplary embodiments, the CDS may perform a digital double sampling that converts the analog reset signal and the analog data signal into two digital signals and extracts the effective signal component based on a difference between the two digital signals. In still one or more other exemplary embodiments, the CDS may perform a dual correlated double sampling that performs both the analog double sampling and the digital double sampling. Furthermore, the CDS may be an on-chip CDS or an off-chip CDS. Moreover, according to another exemplary embodiment, the CDS may perform a pseudo-correlated double sampling.

The DSP 550 may receive the digital signals output from the ADC 540, and may perform an image data processing on the digital signals. For example, the DSP 550 may perform image interpolation, color correction, white balance, gamma correction, color conversion, etc.

The controller 560 may control the row driver 530, the ADC 540, and the DSP 550 by providing control signals, such as a clock signal, a timing control signal, or the like. According to one or more exemplary embodiments, the controller 560 may include a control logic circuit, a phase locked loop circuit, a timing control circuit, a communication interface circuit, or the like.

In one or more exemplary embodiments, the controller 560 may receive a user setting signal USS for determining an operation mode of the image sensor 500. The user setting signal USS may be externally provided, for example, may be provided from a user. Furthermore, the user setting signal USS may be a default value (e.g., set by a manufacturer or in a boot process), may be provided from another application, etc. A DCG control signal (e.g., DX in FIG. 1) applied to the unit pixel in the pixel array 510 may be selectively activated based on the user setting signal USS. For example, when the user setting signal USS has a first value corresponding to a high illuminance operation mode, the controller 560 may activate the DCG control signal, and thus the unit pixel in the pixel array 510 and the image sensor 500 may operate as the example illustrated in FIG. 10B based on the activated DCG control signal. When the user setting signal USS has a second value corresponding to a low illuminance operation mode, the controller 560 may deactivate the DCG control signal, and thus the unit pixel in the pixel array 510 and the image sensor 500 may operate as the example illustrated in FIG. 10A based on the deactivated DCG control signal. In the image sensor 500 of FIG. 22, it may be manually determined whether the DCG control signal is activated based on the user setting signal USS.

Figure 23:
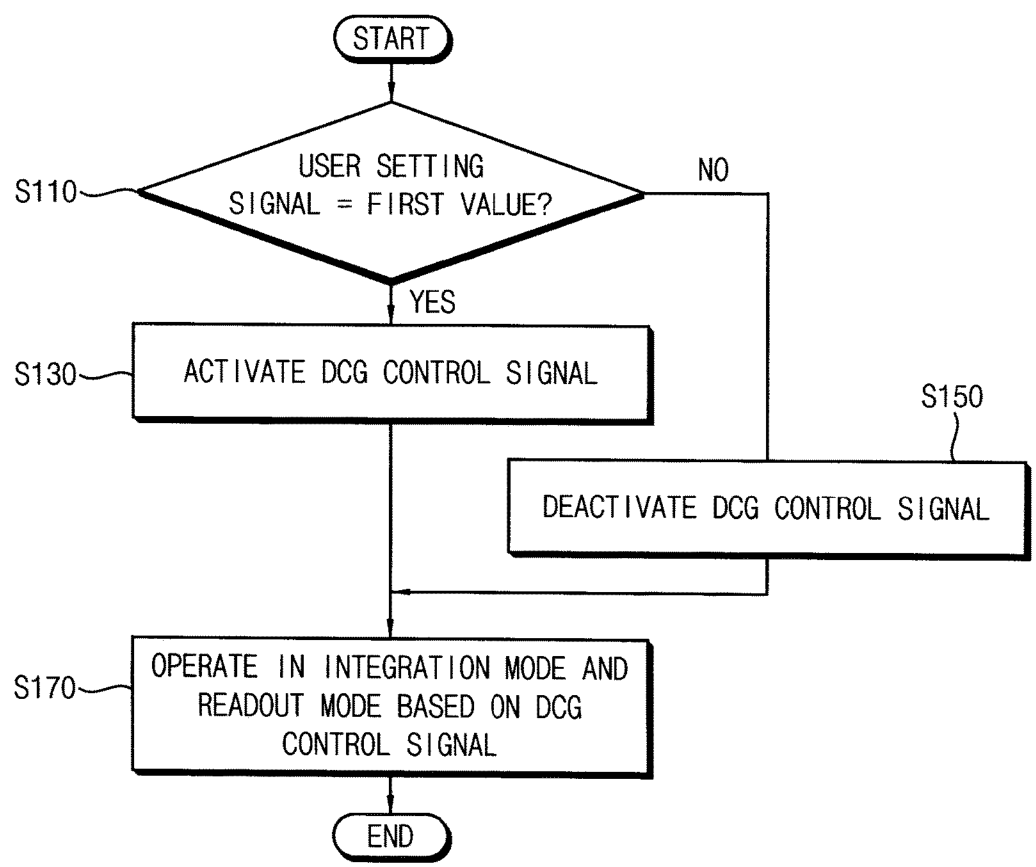
FIG. 23 is a flowchart for describing an operation of the image sensor of FIG. 22.

FIG. 23 is a flowchart for describing an operation of the image sensor of FIG. 22.

Referring to FIGS. 22 and 23, the controller 560 included in the signal processor 520 may determine whether the user setting signal USS has the first value or the second value (operation S110).

When the user setting signal USS has the first value (operation S110: YES), the controller 560 may determine that the image sensor 500 is set in the high illuminance operation mode and may activate the DCG control signal (operation S130). The image sensor 500 may operate in the integration mode TINT and the readout mode TRD of FIG. 10B based on the activated DCG control signal (operation S170).

When the user setting signal USS has the second value (operation S110: NO), the controller 560 may determine that the image sensor 500 is set in the low illuminance operation mode and may deactivate the DCG control signal (operation S150). The image sensor 500 may operate in the integration mode TINT and the readout mode TRD of the FIG. 10A based on the deactivated DCG control signal (operation S170).

Figure 24:
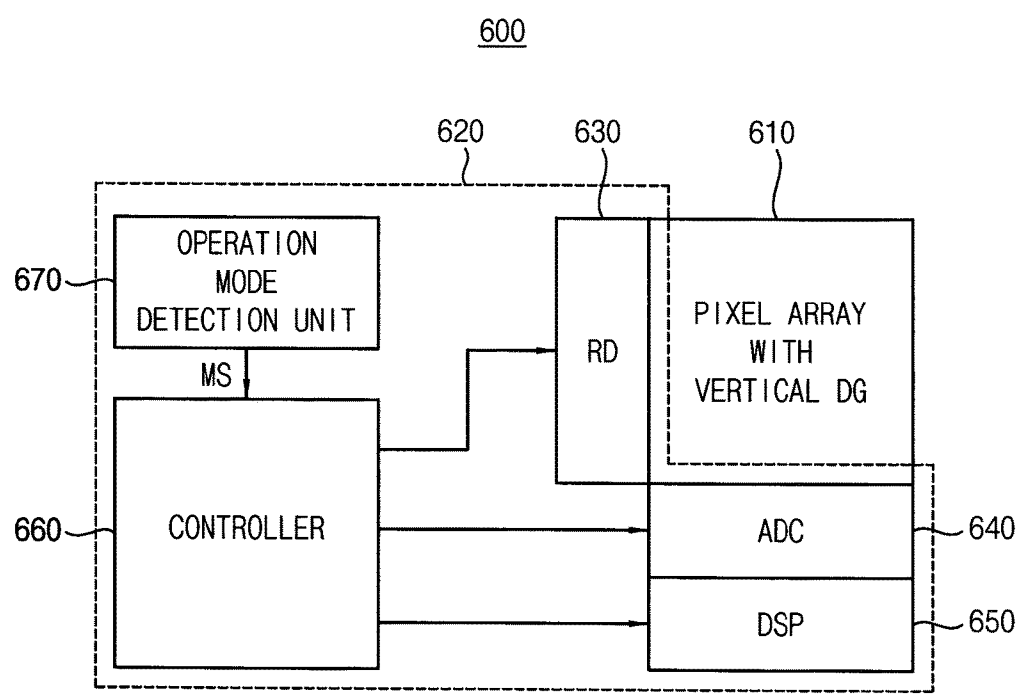
FIG. 24 is a block diagram illustrating an image sensor according to another exemplary embodiment.

FIG. 24 is a block diagram illustrating an image sensor 600 according to another exemplary embodiment.

Referring to FIG. 24, the image sensor 600 includes a pixel array 610 and a signal processor 620.

The pixel array 610 includes a plurality of unit pixels and generates a plurality of pixel signals based on incident light. The signal processor 620 generates image data based on the plurality of pixel signals. The signal processor 620 may include a row driver 630, an ADC 640, a DSP 650, a controller 660, and an operation mode detector 670. The pixel array 610, the row driver 630, the ADC 640, and the DSP 650 in FIG. 24 may be the same as, substantially the same as, or similar to the pixel array 510, the row driver 530, the ADC 540, and the DSP 550 in FIG. 22, respectively.

The operation mode detector 670 may automatically determine an operation mode of the image sensor 600 based on illuminance of the incident light and a reference illuminance. For example, when the illuminance of the incident light is higher than the reference illuminance, the operation mode detector 670 may generate a mode signal MS that has a first value corresponding to a high illuminance operation mode. When the illuminance of the incident light is equal to or lower than the reference illuminance, the operation mode detector 670 may generate the mode signal MS that has a second value corresponding to a low illuminance operation mode.

The controller 660 may control the row driver 630, the ADC 640, and the DSP 650. In one or more exemplary embodiments, the controller 660 may receive the mode signal MS, and a DCG control signal (e.g., DX in FIG. 1) applied to the unit pixel in the pixel array 610 may be selectively activated based on the received mode signal MS. For example, when the mode signal MS has the first value, the controller 660 may activate the DCG control signal, and thus the unit pixel in the pixel array 610 and the image sensor 600 may operate as the example illustrated in FIG. 10B based on the activated DCG control signal. When the mode signal MS has the second value, the controller 660 may deactivate the DCG control signal, and thus the unit pixel in the pixel array 610 and the image sensor 600 may operate as the example illustrated in FIG. 10A based on the deactivated DCG control signal. In the image sensor 600 of FIG. 24, it may be automatically determined whether the DCG control signal is activated based on the illuminance of the incident light.

Figure 25:
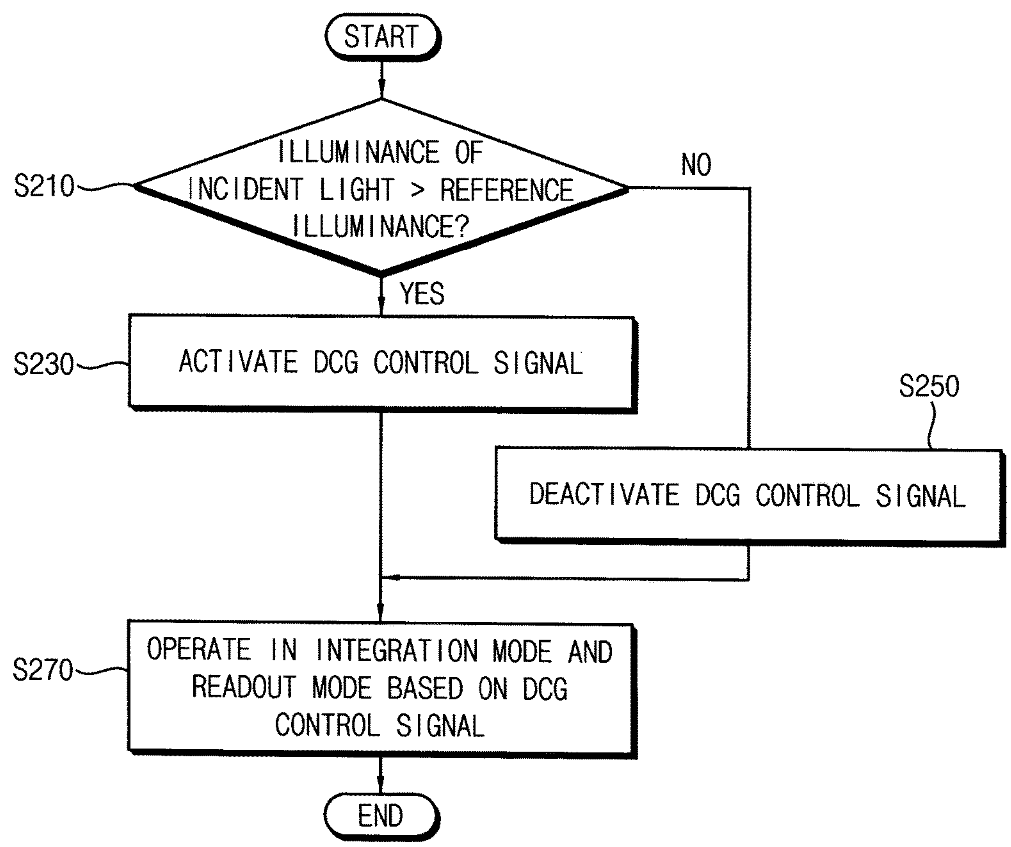
FIG. 25 is a flowchart for describing an operation of the image sensor of FIG. 24.

FIG. 25 is a flowchart for describing an operation of the image sensor of FIG. 24.

Referring to FIGS. 24 and 25, the controller 660 included in the signal processor 620 may determine whether the illuminance of the incident light is higher than, equal to, or lower than the reference illuminance (operation S210).

When the illuminance of the incident light is higher than the reference illuminance (operation S210: YES), the operation mode detector 670 included in the signal processor 620 may generate the mode signal MS that has the first value corresponding to the high illuminance operation mode, and the controller 660 may activate the DCG control signal based on the mode signal MS (operation S230). The image sensor 600 may operate in the integration mode TINT and the readout mode TRD of the FIG. 10B based on the activated DCG control signal (operation S270).

When the illuminance of the incident light is equal to or lower than the reference illuminance (operation S210: NO), the operation mode detector 670 may generate the mode signal MS that has the second value corresponding to the low illuminance operation mode, and the controller 660 may deactivate the DCG control signal based on the mode signal MS (operation S250). The image sensor 600 may operate in the integration mode TINT and the readout mode TRD of the FIG. 10A based on the deactivated DCG control signal (operation S270).

Figure 26:
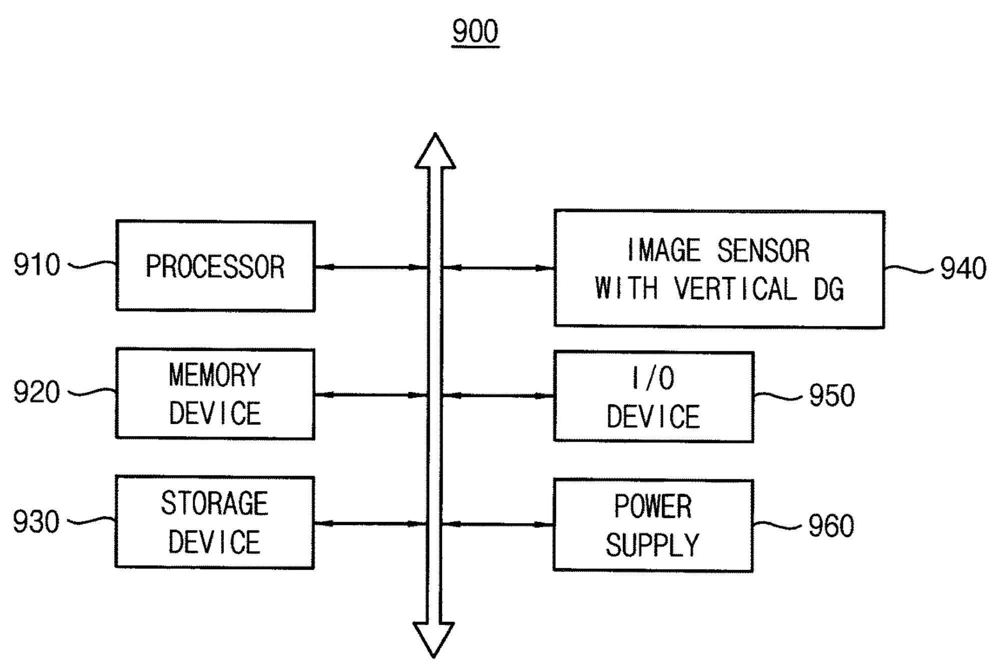
FIG. 26 is a block diagram illustrating a computing system including an image sensor according to an exemplary embodiment.

FIG. 26 is a block diagram illustrating a computing system 900 including an image sensor 940 according to an exemplary embodiment.

Referring to FIG. 26, the computing system 900 may include a processor 910, a memory device 920, a storage device 930, an image sensor 940, an input/output (I/O) device 950, and a power supply 960. Moreover, it is understood that the computing system 900 may further include ports that communicate with a video card, a sound card, a memory card, a universal serial bus (USB) device, or other electronic devices.

The processor 910 may perform various calculations or tasks. According to various exemplary embodiments, the processor 910 may be a microprocessor, a central processing unit (CPU), etc. The processor 910 may communicate with the memory device 920, the storage device 930, and the I/O device 950 via an address bus, a control bus, and/or a data bus. In one or more exemplary embodiments, the processor 910 may be coupled to an extended bus, such as a peripheral component interconnection (PCI) bus.

The memory device 920 may store data for operating the computing system 900. For example, the memory device 920 may be implemented with at least one volatile memory device, e.g., a dynamic random access memory (DRAM) device, a static random access memory (SRAM) device, etc., and/or at least one nonvolatile memory device, e.g., an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc.

The storage device 930 may include a solid state drive (SSD), a hard disk drive (HDD), a CD-ROM, etc. The I/O device 950 may include an input device (e.g., a keyboard, a keypad, a mouse, a touch screen, a rotatable dial, one or more buttons, a microphone, a camera, etc.) and an output device (e.g., a printer, a display device, etc.). The power supply 960 may supply operation voltages for the computing system 900.

The image sensor 940 may communicate with the processor 910 via the bus and/or other communication links. The image sensor 940 may be one of the image sensor 500 of FIG. 22 and the image sensor 600 of FIG. 24 and may include a plurality of unit pixels. Each unit pixel may be the unit pixel 100 of FIG. 1 and may be implemented with examples described above with reference to FIGS. 2 through 5, 7 through 9, 11, 13, and 16 through 21. In other words, each unit pixel may include the DCG gate having the vertical gate structure such that a surface area of the DCG gate contacting the semiconductor substrate is increased. As the DCG control signal applied to the DCG gate is selectively activated, a conversion gain of each unit pixel and a conversion gain of the image sensor 940 may be effectively adjusted without a decrease in a fill factor.

The image sensor 940 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (S SOP), thin small outline package (TSOP), system in package (SIP), multi chip package (MCP), wafer-level fabricated package (WFP), wafer-level processed stack package (WSP), etc.

In one or more exemplary embodiments, the image sensor 940 and the processor 910 may be fabricated as one integrated circuit chip. In other example embodiments, the image sensor 940 and the processor 910 may be fabricated as two separate integrated circuit chips.

The computing system 900 may be any computing system using a three-dimensional (3D) image sensor. For example, the computing system 900 may include a portable electronic device, a digital camera, a mobile phone, a smart phone, a portable multimedia player (PMP), a personal digital assistant (PDA), a personal computer, a server computer, a workstation, a laptop computer, a tablet computer, a digital television, a set-top box, a music player, a portable game console, a navigation system, etc.

Figure 27:
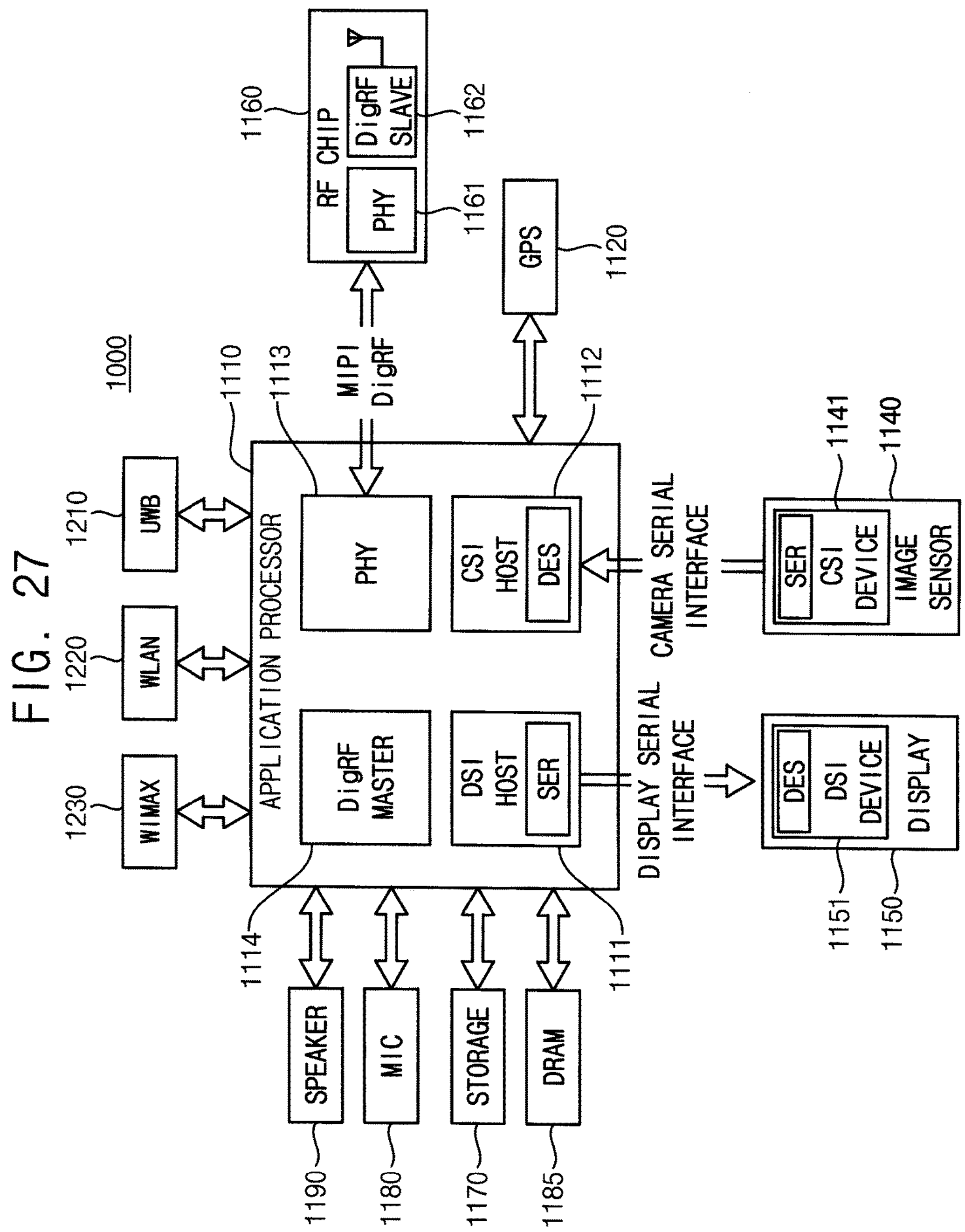
FIG. 27 is a block diagram illustrating an example of an interface employable in a computing system according to an exemplary embodiment.

FIG. 27 is a block diagram illustrating an example of an interface employable in a computing system 1000 according to an exemplary embodiment. For example, the computing system 1000 may be the computing system 900 described above with reference to FIG. 26.

Referring to FIG. 27, the computing system 1000 may be implemented by a data processing device (e.g., a portable electronic device) that uses or supports a mobile industry processor interface (MIPI) interface. The computing system 1000 may include an application processor 1110, an image sensor 1140, a display device 1150, etc.

A camera serial interface (CSI) host 1112 of the application processor 1110 may perform a serial communication with a CSI device 1141 of the image sensor 1140 via a CSI. In one or more exemplary embodiments, the CSI host 1112 may include a deserializer (DES), and the CSI device 1141 may include a serializer (SER). A display serial interface (DSI) host 1111 of the application processor 1110 may perform a serial communication with a DSI device 1151 of the display device 1150 via a DSI. In one or more exemplary embodiments, the DSI host 1111 may include a serializer (SER), and the DSI device 1151 may include a deserializer (DES).

The computing system 1000 may further include a radio frequency (RF) chip 1160 performing a communication with the application processor 1110. A physical layer (PHY) 1113 of the computing system 1000 and a physical layer (PHY) 1161 of the RF chip 1160 may perform data communications based on a MIPI DigRF. The application processor 1110 may further include a DigRF MASTER 1114 that controls the data communications of the PHY 1161. The RF chip 1160 may further include a DigRF SLAVE 1162 that is controlled through the DigRF MASTER 1114.

The computing system 1000 may further include a global positioning system (GPS) 1120, a storage 1170, a microphone MIC 1180, a DRAM device 1185, and a speaker 1190. In addition, the computing system 1000 may perform communications using an ultra wideband (UWB) 1210, a wireless local area network (WLAN) 1220, a worldwide interoperability for microwave access (WIMAX) 1230, etc. However, the structure and the interface of the computing system 1000 are not limited thereto.

The above-described exemplary embodiments may be applied to an image sensor and an electronic system having the image sensor. For example, the electronic system may be a system using the image sensor, e.g., a computer, a digital camera, a 3D camera, a cellular phone, a PDA, a scanner, a navigation system, a video phone, a surveillance system, an auto-focusing system, a tracking system, a motion-sensing system and/or an image-stabilization system.

The foregoing is illustrative of exemplary embodiments and is not to be construed as limiting thereof. Although a few exemplary embodiments have been described, those skilled in the art will readily appreciate that many modifications are possible in these exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A method of manufacturing a unit pixel of an image sensor, the method comprising:

forming a photoelectric conversion region in a substrate;

forming, in the substrate, a first floating diffusion region spaced apart from the photoelectric conversion region of the substrate, and a second floating diffusion region spaced apart from the first floating diffusion region;

forming a first recess spaced apart from the first floating diffusion region and the second floating diffusion region by removing a portion of the substrate from a first surface of the substrate;

filling the first recess to form a dual conversion gain (DCG) gate that extends perpendicularly or substantially perpendicularly from the first surface of the substrate; and forming a conductive layer to fill an inside of the first recess.

2. The method as claimed in claim 1, wherein the forming the recess comprises forming the recess to have a bottom surface with a rounded corner.

3. The method as claimed in claim 2, wherein the rounded corner forms an arc having a radius of about 10 nm to about 100 nm.

4. The method as claimed in claim 2, wherein the rounded corner forms an arc having a radius of about 60 nm to about 100 nm.

5. The method as claimed in claim 1, further comprising:

forming a second recess spaced apart from the first floating diffusion region by removing a portion of the substrate from a first surface of the substrate.

6. The method as claimed in claim 5, wherein the filling the first recess comprises filling the first recess and the second recess to form the DCG gate.

7. The method as claimed in claim 5, further comprising filling the second recess to form a transfer gate.

8. The method as claimed in claim 1, further comprising forming a transfer gate over the substrate between the photoelectric conversion region and the first floating diffusion region.

9. The method as claimed in claim 1, further comprising forming a first dielectric layer on the first surface of the substrate and a surface of the first recess, wherein the filling the first recess comprises filling the first recess to form the DCG gate on the first dielectric layer.

10. The method as claimed in claim 9, further comprising forming a second dielectric layer on the DCG gate.

11. The method as claimed in claim 1, further comprising forming a color filter on a second surface of the substrate, opposite the first surface.

12. The method as claimed in claim 11, further comprising forming a micro lens on the color filter.

13. The method as claimed in claim 10, further comprising forming a color filter on the second dielectric layer.

14. The method as claimed in claim 13, further comprising forming a micro lens on the color filter.

15. The method as claimed in claim 1, further comprising forming an isolation region to extend vertically or substantially vertically from the first surface and defining a unit pixel area including the photoelectric conversion region, the first floating diffusion region, the second floating diffusion region, and the DCG gate.

16. The method as claimed in claim 15, wherein the isolation region comprises a dielectric material having a refractive index that is less than a refractive index of the substrate.

17. The method as claimed in claim 1, wherein the forming the recess comprises removing the portion of the substrate to a depth in the substrate that is greater than half of a depth of the first floating diffusion region and half of a depth of the second floating diffusion region.

18. The method as claimed in claim 1, wherein the forming the recess comprises removing the portion of the substrate to a depth that is less than half of a depth of the first floating diffusion region and half of a depth of the second floating diffusion region.

19. The method as claimed in claim 1, wherein the forming the recess comprises removing the portion of the substrate to a depth that is less than a depth of the first floating diffusion region and a depth of the second floating diffusion region.

20. The method as claimed in claim 1, wherein the forming the recess comprises forming the recess between the first floating diffusion region and the second floating diffusion region.

* * * * *